US010811270B2

(12) United States Patent
Chen et al.

(10) Patent No.: US 10,811,270 B2
(45) Date of Patent: Oct. 20, 2020

(54) ULTRA NARROW TRENCH PATTERNING USING PLASMA ETCHING

(71) Applicant: Taiwan Semiconductor Manufacturing Company, Ltd., Hsinchu (TW)

(72) Inventors: Chao-Hsuan Chen, Hsinchu (TW); Yuan-Sheng Huang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/354,364

(22) Filed: Mar. 15, 2019

(65) Prior Publication Data
US 2020/0294809 A1  Sep. 17, 2020

(51) Int. Cl.
*H01L 21/02* (2006.01)
*H01L 21/308* (2006.01)
*H01L 21/8234* (2006.01)
*H01L 21/3213* (2006.01)

(52) U.S. Cl.
CPC ...... *H01L 21/3088* (2013.01); *H01L 21/3086* (2013.01); *H01L 21/32139* (2013.01); *H01L 21/823431* (2013.01); *H01L 21/823437* (2013.01)

(58) Field of Classification Search
CPC .............. H01L 21/308; H01L 21/3086; H01L 21/32139; H01L 21/02; H01L 21/823437; H01L 21/823431; H01L 21/8234; H01L 21/3213; H01L 21/027; H01L 21/28; H01L 21/475; H01L 21/0274; H01L 21/28141; H01L 21/3088; H01L 21/311; H01L 21/3105; H01L 21/31111; H01L 21/0217; H01L 21/02186; H01L 21/3081; H01L 21/02282; H01L 21/31055; H01L 21/0276; H01L 29/768; H01L 29/66; H01L 29/78; H01L 29/785; H01L 29/66795; H01L 29/76816
USPC .......................................................... 438/703
See application file for complete search history.

(56) References Cited

U.S. PATENT DOCUMENTS

| | | | |
|---|---|---|---|
| 5,858,621 A * | 1/1999 | Yu ........................... | G03F 7/094 430/312 |
| 8,409,456 B2 * | 4/2013 | Lan ................... | H01L 21/31138 216/38 |
| 8,796,666 B1 | 8/2014 | Huang et al. | |
| 9,012,132 B2 | 4/2015 | Chang | |
| 9,028,915 B2 | 5/2015 | Chang et al. | |
| 9,093,530 B2 | 7/2015 | Huang et al. | |
| 9,146,469 B2 | 9/2015 | Liu et al. | |
| 9,153,478 B2 * | 10/2015 | Liu .................... | H01L 21/76816 |
| 9,213,234 B2 | 12/2015 | Chang | |

(Continued)

FOREIGN PATENT DOCUMENTS

KR          101898764 B1          9/2018

*Primary Examiner* — Chuong A Luu
(74) *Attorney, Agent, or Firm* — Slater Matsil, LLP

(57) ABSTRACT

A method includes forming a polymer layer on a patterned photo resist. The polymer layer extends into an opening in the patterned photo resist. The polymer layer is etched to expose the patterned photo resist. The polymer layer and a top Bottom Anti-Reflective Coating (BARC) are etched to pattern the top BARC, in which the patterned photo resist is used as an etching mask. The top BARC is used as an etching mask to etching an underlying layer.

20 Claims, 31 Drawing Sheets

(56) References Cited

U.S. PATENT DOCUMENTS

| | | |
|---|---|---|
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 9,761,488 B2 | 9/2017 | Cheng et al. |
| 2019/0348280 A1* | 11/2019 | Wu .................... H01L 21/0274 |

* cited by examiner

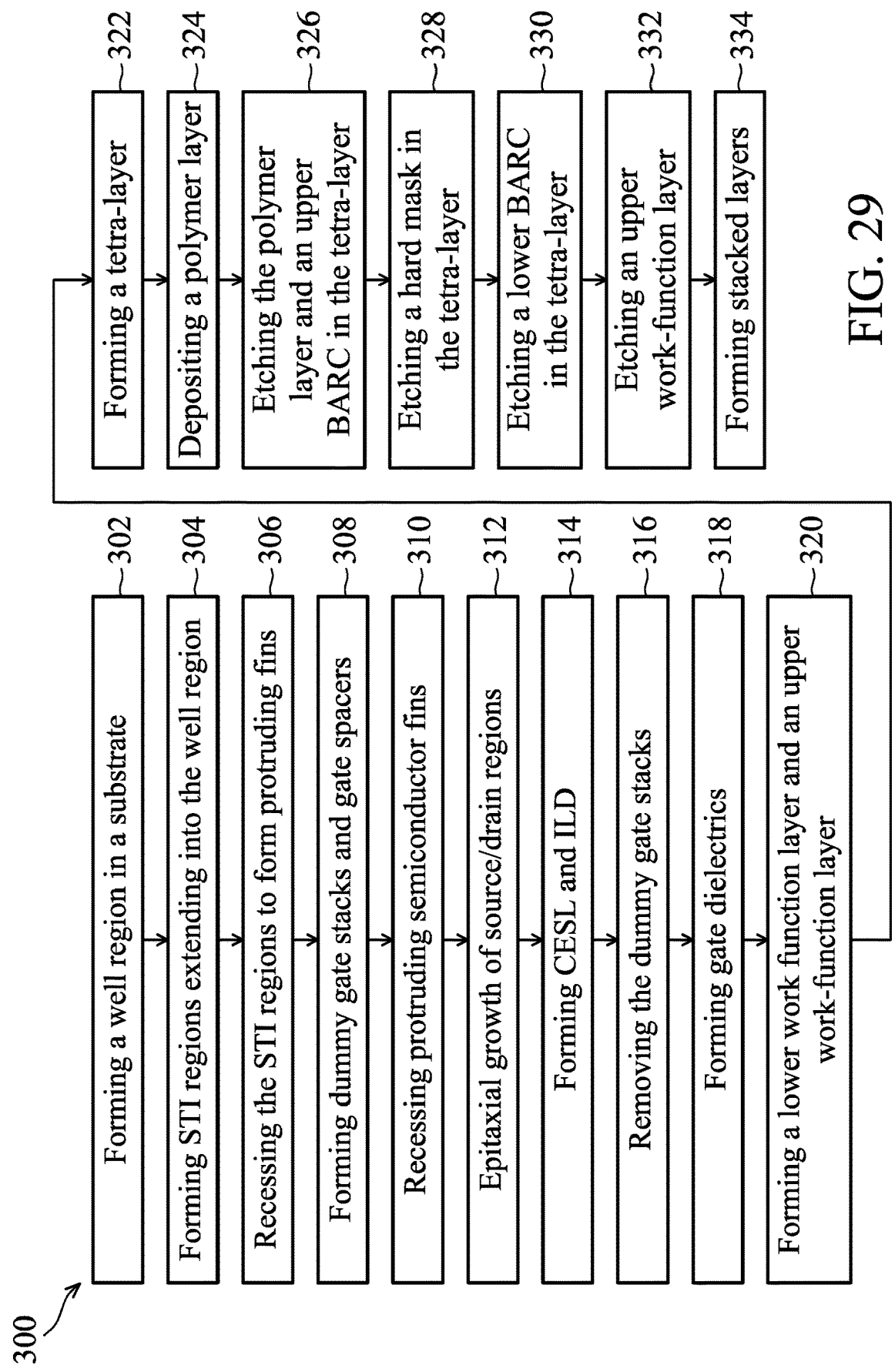

ULTRA NARROW TRENCH PATTERNING USING PLASMA ETCHING

BACKGROUND

With the increasing down-scaling of integrated circuits, the features such as metal lines, trenches, dielectric regions, etc. become increasingly smaller. The down-scaling reaches a bottle neck when the limit of the photo lithography process is reached. For example, when using 193-nm immersion patterning for forming periodic trenches, the smallest width of the trenches is about 50 nm. This dimension, although being small enough for some existing integrated circuits, is still too large for forming smaller integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 29 illustrates a process flow for forming a FinFET in accordance with some embodiments.

DETAILED DESCRIPTION

Figure 1:
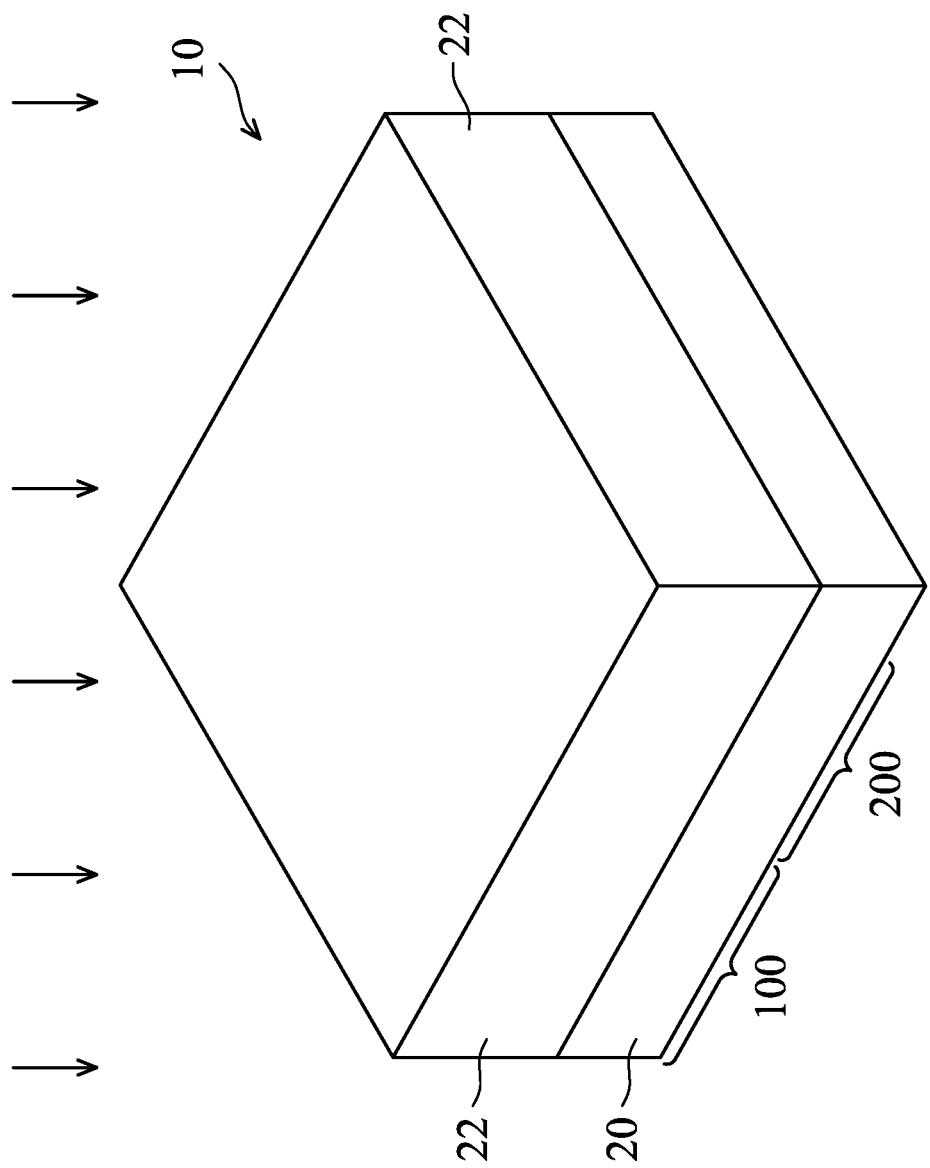
FIGS. 1-7, 8A, 8B, 9, 10A, 10B, 10C, and 11-17 illustrate the perspective views, plane views, and cross-sectional views of intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Patterning processes adopting tetra-layer etching masks are provided in accordance with various embodiments. The intermediate stages in the etching processes are illustrated in accordance with some embodiments. Some variations of some embodiments are discussed. Throughout the various views and illustrative embodiments, like reference numbers are used to designate like elements. In accordance with some example embodiments of the present disclosure, neighboring FinFETs with their fins closely located to each other are formed using tetra-layer etching masks, which are used to split a trench pattern into two narrower trench patterns. Accordingly, the dimension and/or a pitch of patterns may be reduced by more than a half.

Embodiments will be described with respect to a specific context, namely the patterning process using a tetra-layer etching mask, and specifically to the formation of metal gates and cut-fin processes of FinFETs and the formation of conductive features in dielectric layers. The concept of the discussed embodiments may also be applied to the structure and the processing of other structures including, and not limited to, the formation of trenches and the etching of metal, semiconductor, and/or dielectric features. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed as being performed in a particular order, other method embodiments may be performed in any logical order.

FIGS. 1-7, 8A, 8B, 9, 10A, 10B, 10C, and 11-17 illustrate the perspective views, top views, and cross-sectional views of intermediate stages in the formation of Fin Field-Effect Transistors (FinFET) in accordance with some embodiments. The corresponding processes are also reflected schematically in the process flow shown in FIG. 29.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 302 in the process flow 300 shown in FIG. 29. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

FIG. 1 illustrates device region 100, in which a first FinFET is to be formed, and device region 200, in which a second FinFET is to be formed. Each of the device regions 100 and 200 may be a p-type FinFET region or an n-type FinFET region. In accordance with alternative embodiments of the present disclosure, device region 100 is an n-type FinFET region, and device region 200 is a p-type FinFET region. Alternatively, device region 100 is a p-type FinFET region, and device region 200 is an n-type FinFET region. In the discussed example, device regions 100 and 200 are an n-type FinFET region and a p-type FinFET region, respectively, while other combinations of FinFETs are also contemplated.

Figure 2:
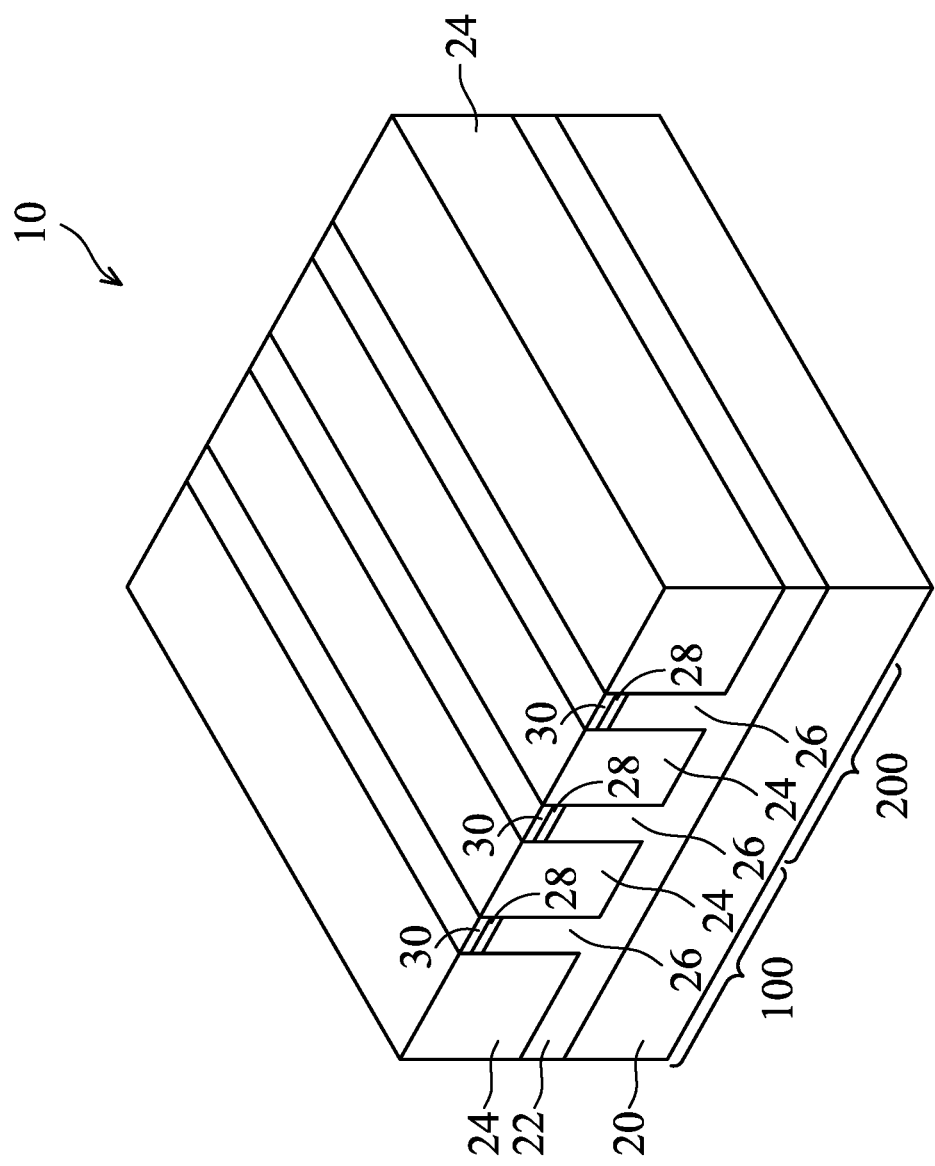

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 304 in the process flow 300 shown in FIG. 29. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy process to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
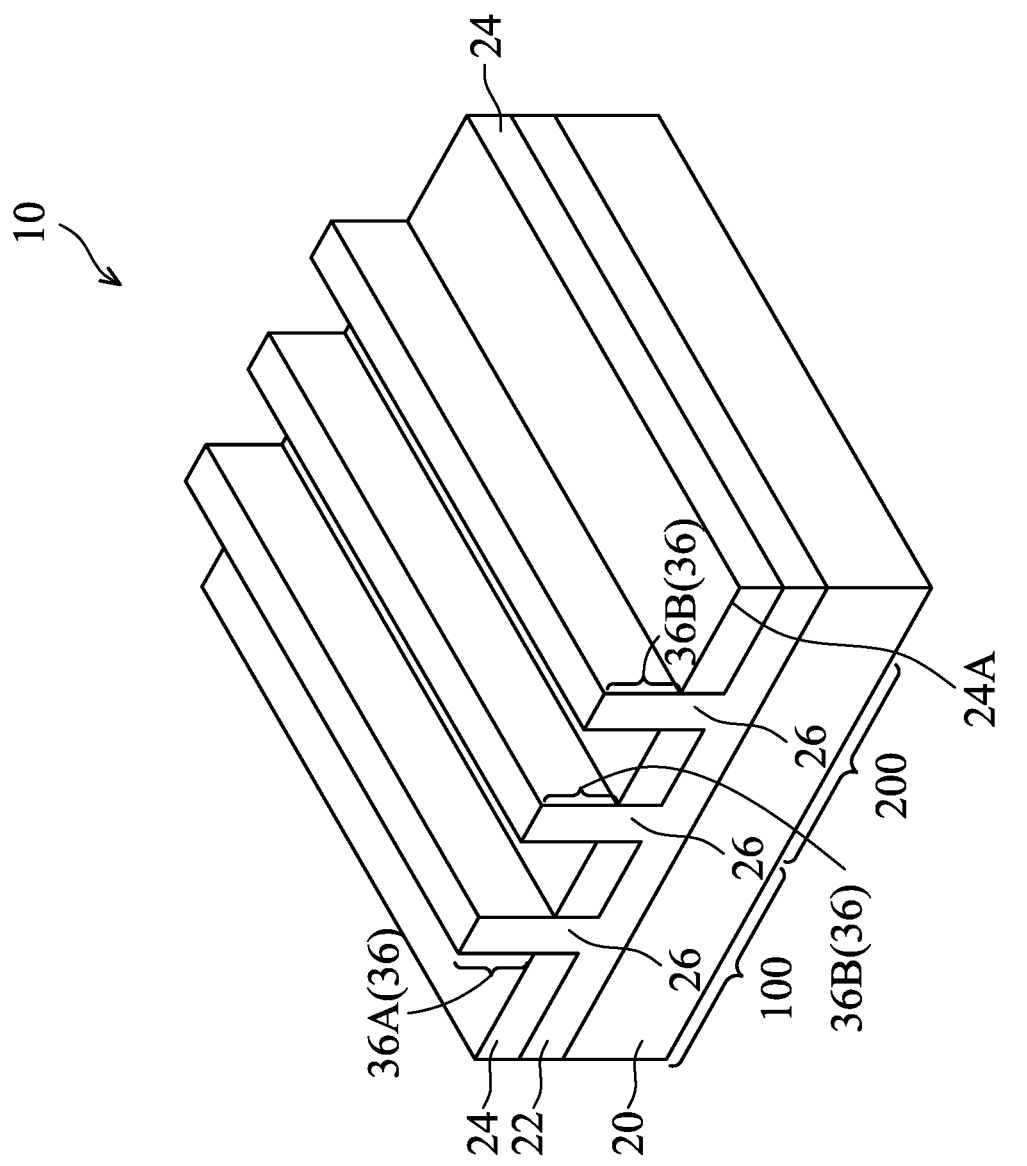

Referring to FIG. 3, STI regions 24 are recessed, so that the top portions of semiconductor strips 26 protrude higher than the top surfaces 24A of the remaining portions of STI regions 24 to form protruding fins 36. The protruding fin in device region 100 is also referred to as protruding fin 36A, and the protruding fins in device region 200 are also referred to as protruding fins 36B. The respective process is illustrated as process 306 in the process flow 300 shown in FIG. 29. The etching may be performed using a dry etching process, wherein HF$_3$ and NH$_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
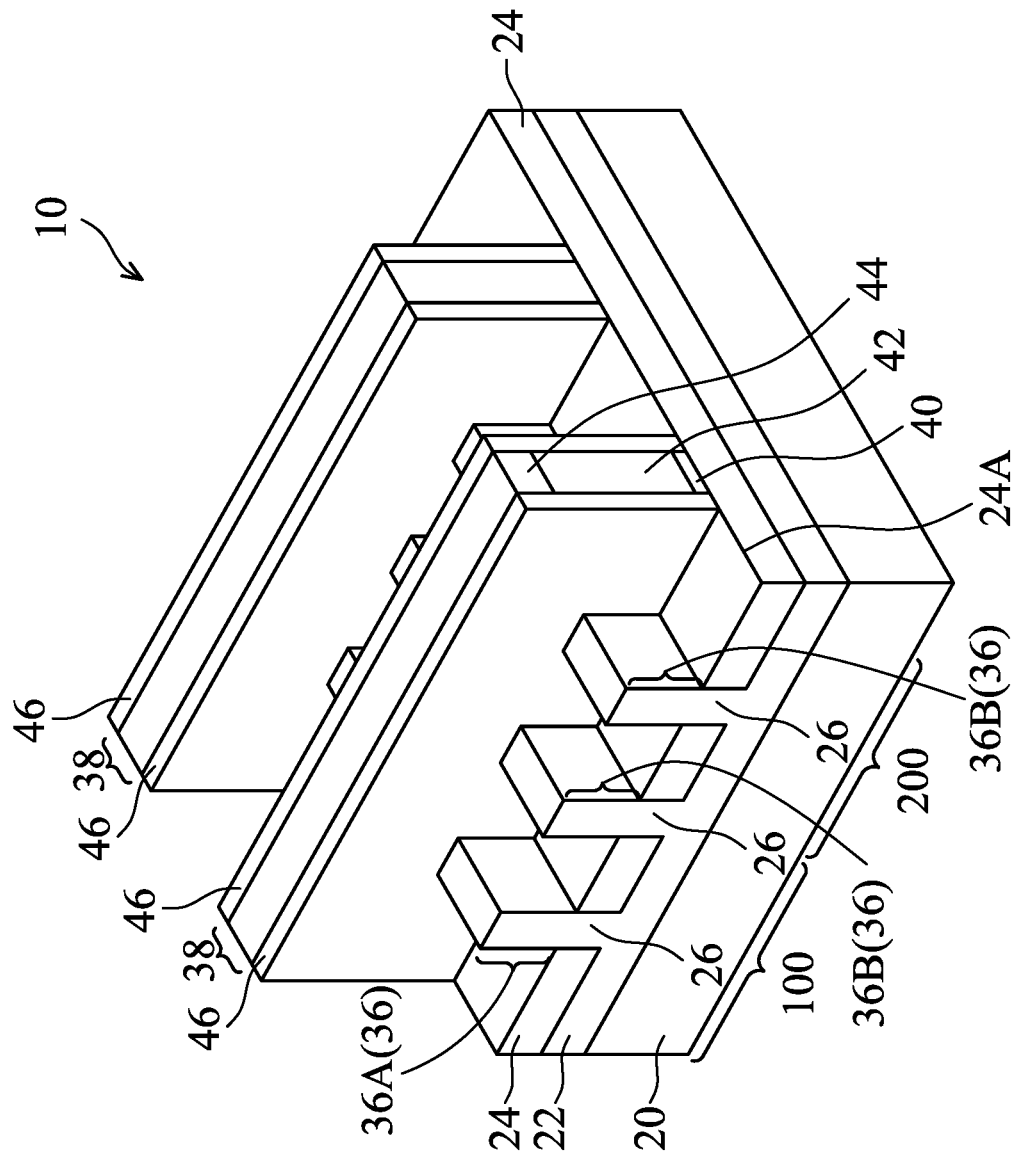

Referring to FIG. 4, dummy gate stacks 38 are formed to extend on the top surfaces and the sidewalls of (protruding) fins 36. The respective process is illustrated as process 308 in the process flow 300 shown in FIG. 29. Dummy gate stacks 38 may include dummy gate dielectrics 40 and dummy gate electrodes 42 over dummy gate dielectrics 40. Dummy gate dielectrics 40 may be formed of silicon oxide. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a plurality of protruding fins 36 and STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 308 in the process flow 300 shown in FIG. 29. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
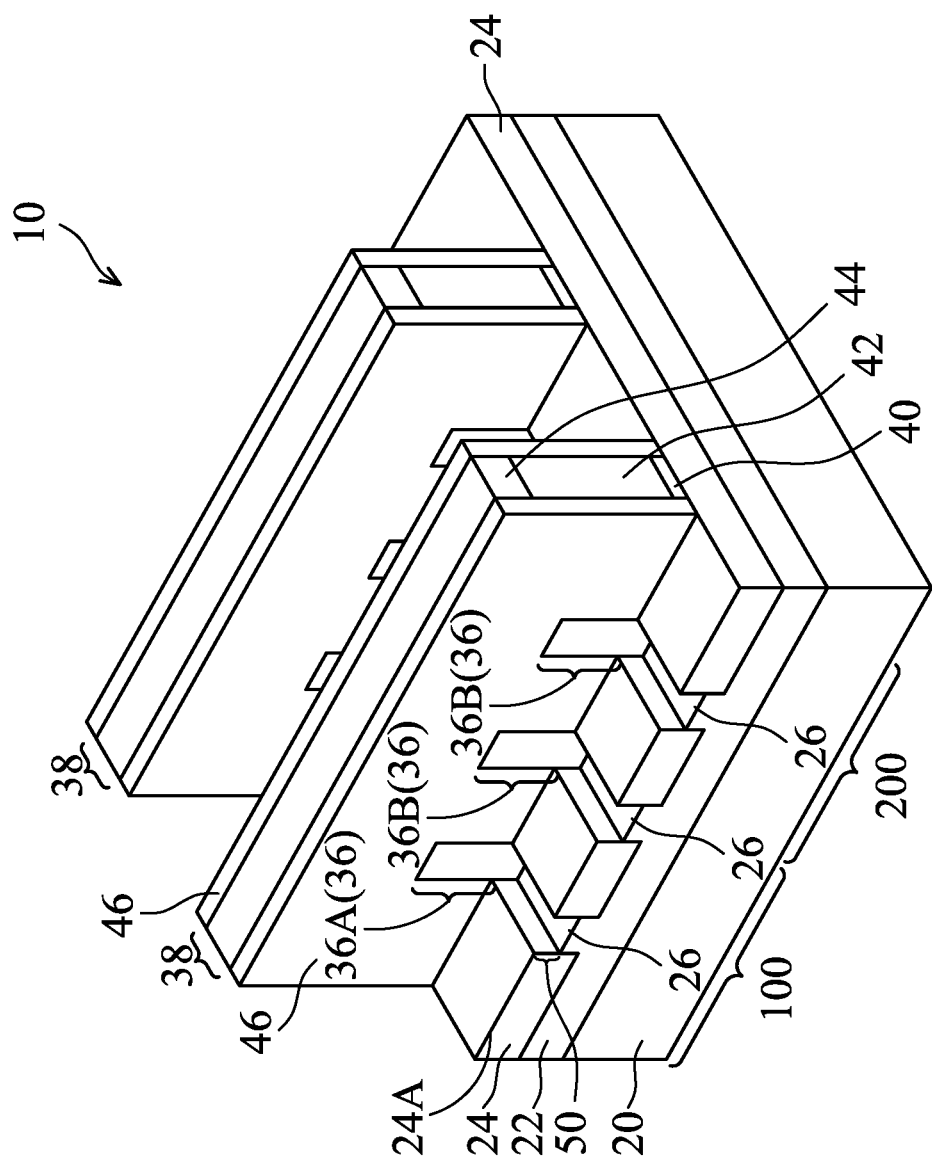

An etching processes is then performed to etch the portions of protruding fins 36 that are not covered by dummy gate stacks 38 and gate spacers 46, resulting in the structure shown in FIG. 5. The respective process is illustrated as process 310 in the process flow 300 shown in FIG. 29. The recessing may be anisotropic, and hence the portions of fins 36 directly underlying dummy gate stacks 38 and gate spacers 46 are protected, and are not etched. Semiconductor strips 26 may be recessed, and the top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
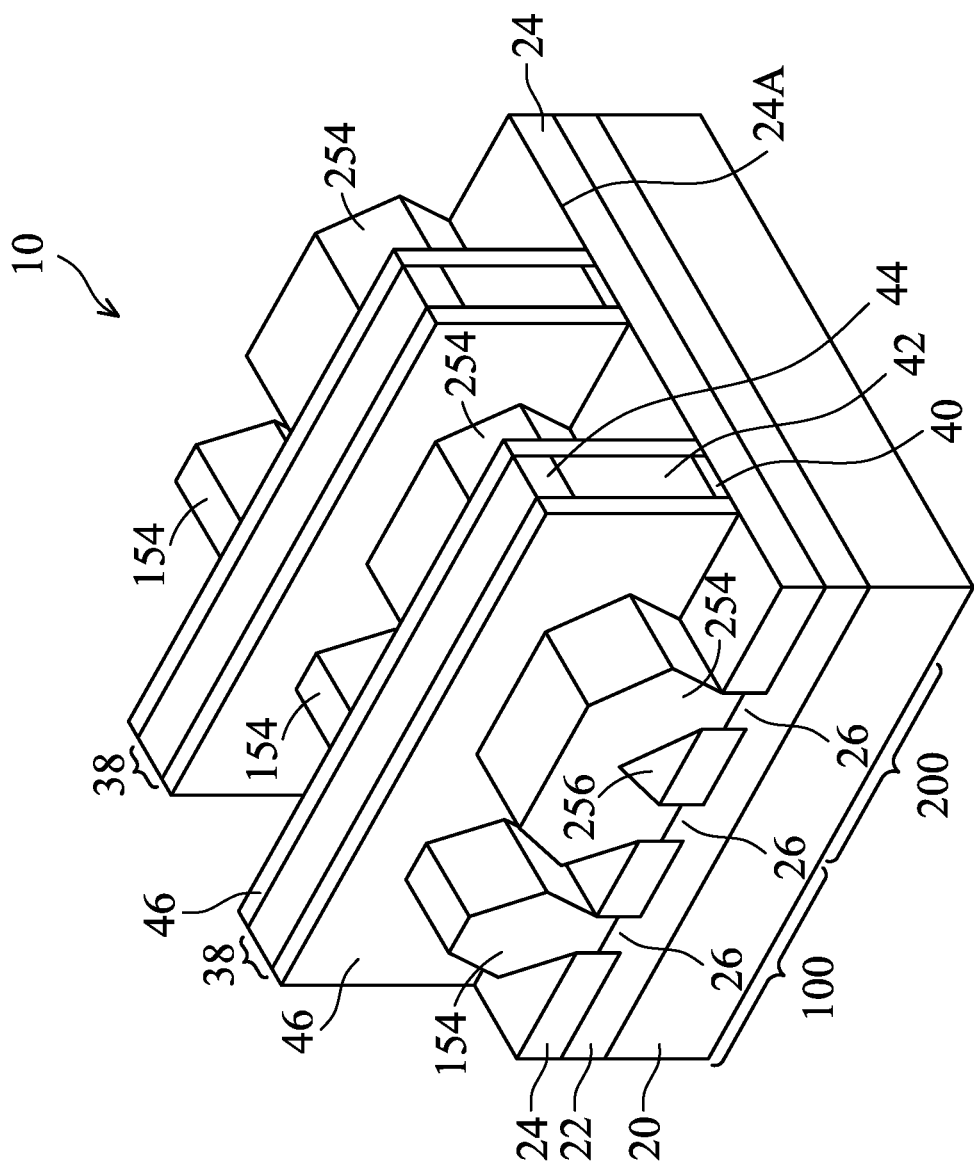

Next, epitaxy regions (source/drain regions) 154 and 254 are formed by selectively growing (through epitaxy) appropriate semiconductor material in recesses 50, resulting in the structure in FIG. 6. The respective process is illustrated as process 312 in the process flow 300 shown in FIG. 29. In accordance with some embodiments of the present disclosure, the formation of epitaxy regions 154 and 254 are performed in separate epitaxy processes, and the details are not discussed herein. In an example embodiment in which device region 100 is an n-type FinFET region, and device region 200 is a p-type FinFET region, an n-type impurity is in-situ doped into epitaxy regions 154 with the proceeding of the epitaxy, and a p-type impurity is in-situ doped into epitaxy regions 254 with the proceeding of the epitaxy. For example, silicon phosphorous (SiP) or silicon carbon phosphorous (SiCP) may be grown as epitaxy regions 154, and silicon germanium boron (SiGeB) or silicon boron (SiB) may be grown as epitaxy regions 254. Recesses 50 are filled with epitaxy regions 154 and 254, and the further epitaxial growth of epitaxy regions 154 and/or 254 causes the respective epitaxy regions to expand horizontally, and facets may be formed. The further growth of epitaxy regions may also cause neighboring epitaxy regions (such as regions 254) to merge with each other. Voids (air gaps, such as 256) may be generated. In accordance with some embodiments of the present disclosure, the formation of epitaxy regions (such as 254) may be finished when the top surface of epitaxy regions 154 and/or 254 is still wavy, or when the top surfaces of the merged epitaxy regions 154 and/or 254 have become planar.

After the epitaxy process, epitaxy regions 154 and/or 254 may be further implanted with a p-type or an n-type impurity to form source and drain regions, which are also denoted using reference numeral 154 and 254. In accordance with alternative embodiments of the present disclosure, the implantation step is skipped when epitaxy regions 154 and 254 are in-situ doped with the n-type and p-type impurity, respectively, during the epitaxy processes.

Figure 7:
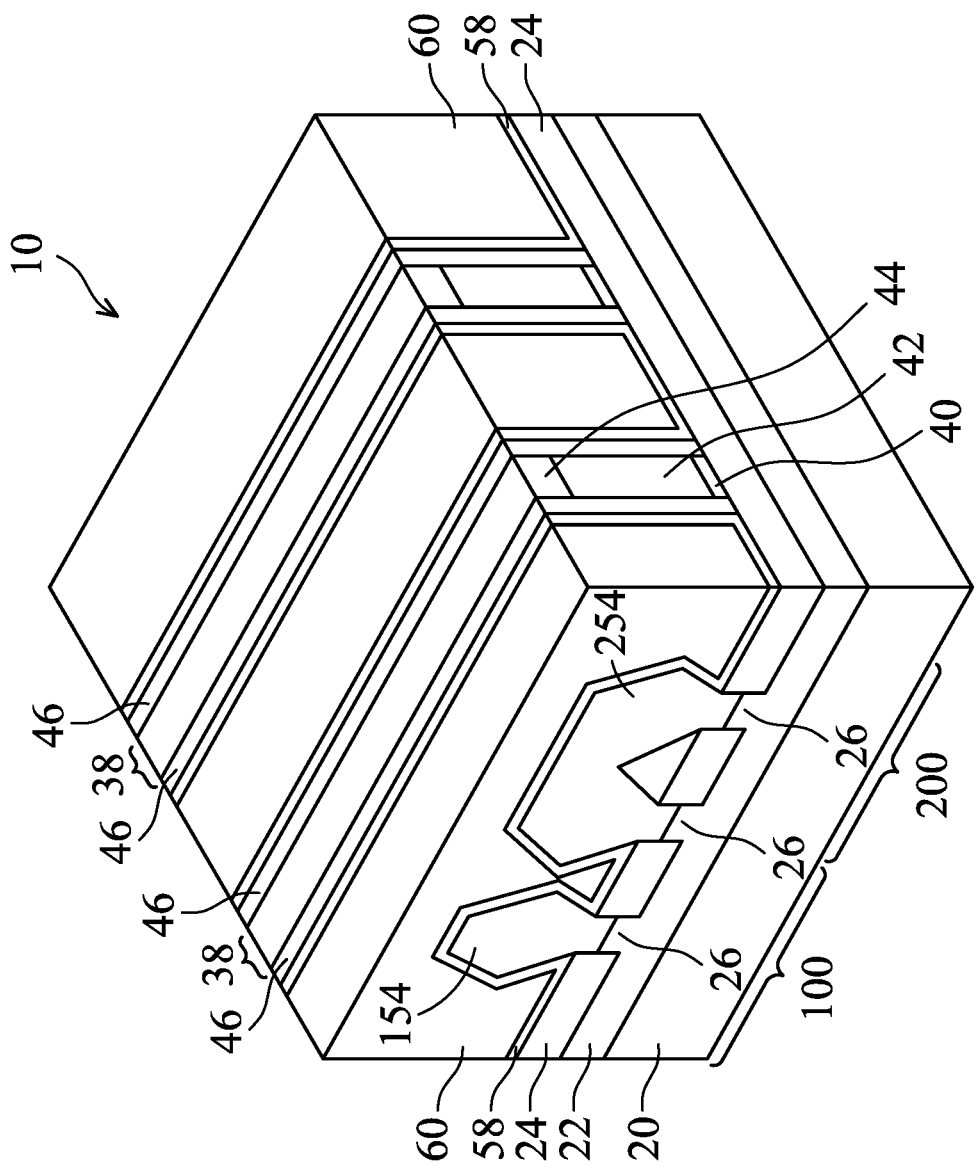

FIG. 7 illustrates a perspective view of the structure after the formation of Contact Etch Stop Layer (CESL) 58 and Inter-Layer Dielectric (ILD) 60. The respective process is illustrated as process 314 in the process flow 300 shown in FIG. 29. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or the like. ILD 60 may be formed of an oxygen-containing dielectric material, which may be a silicon-oxide based material such as Tetra Ethyl Ortho Silicate (TEOS) oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 8A:
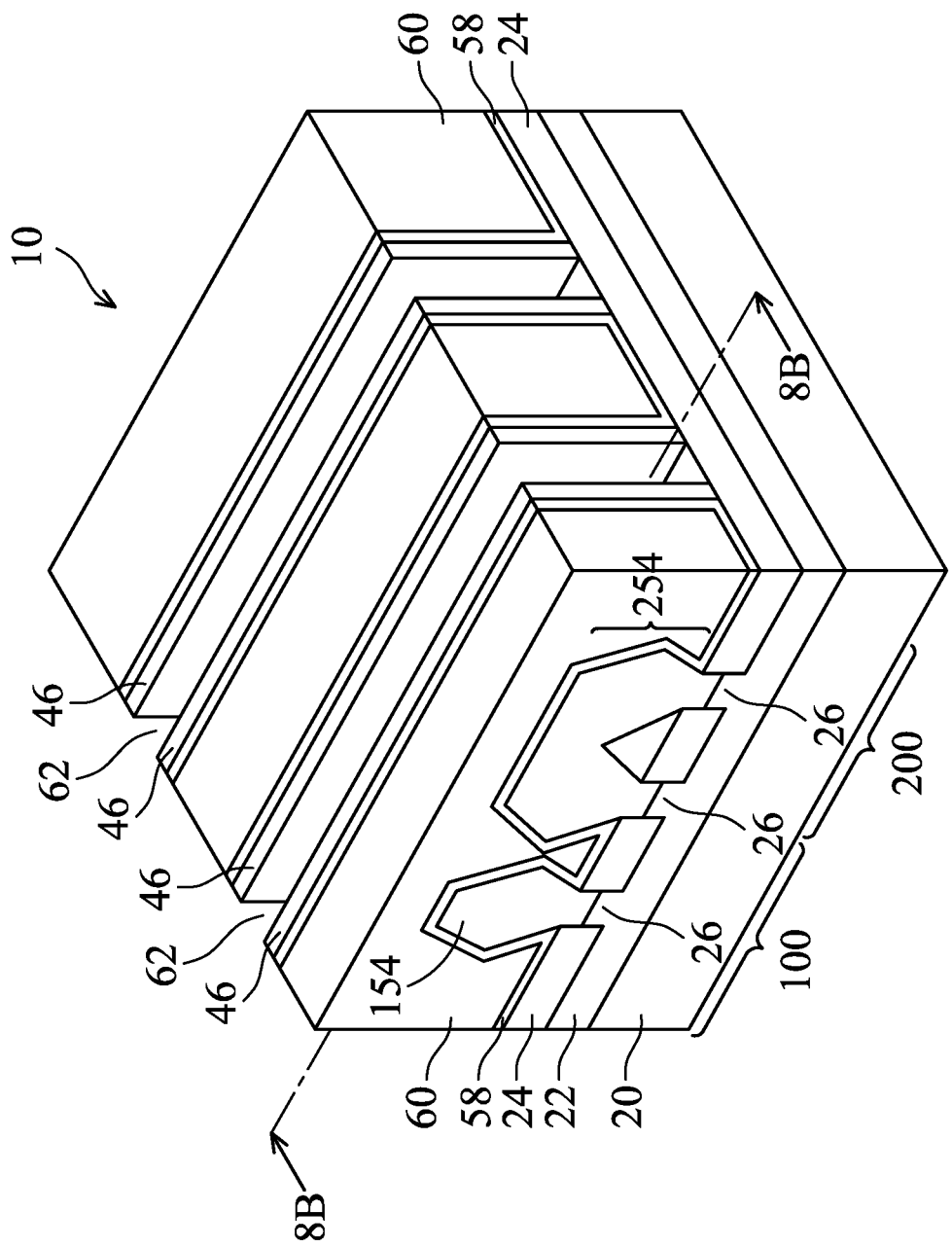
Figure 8B:
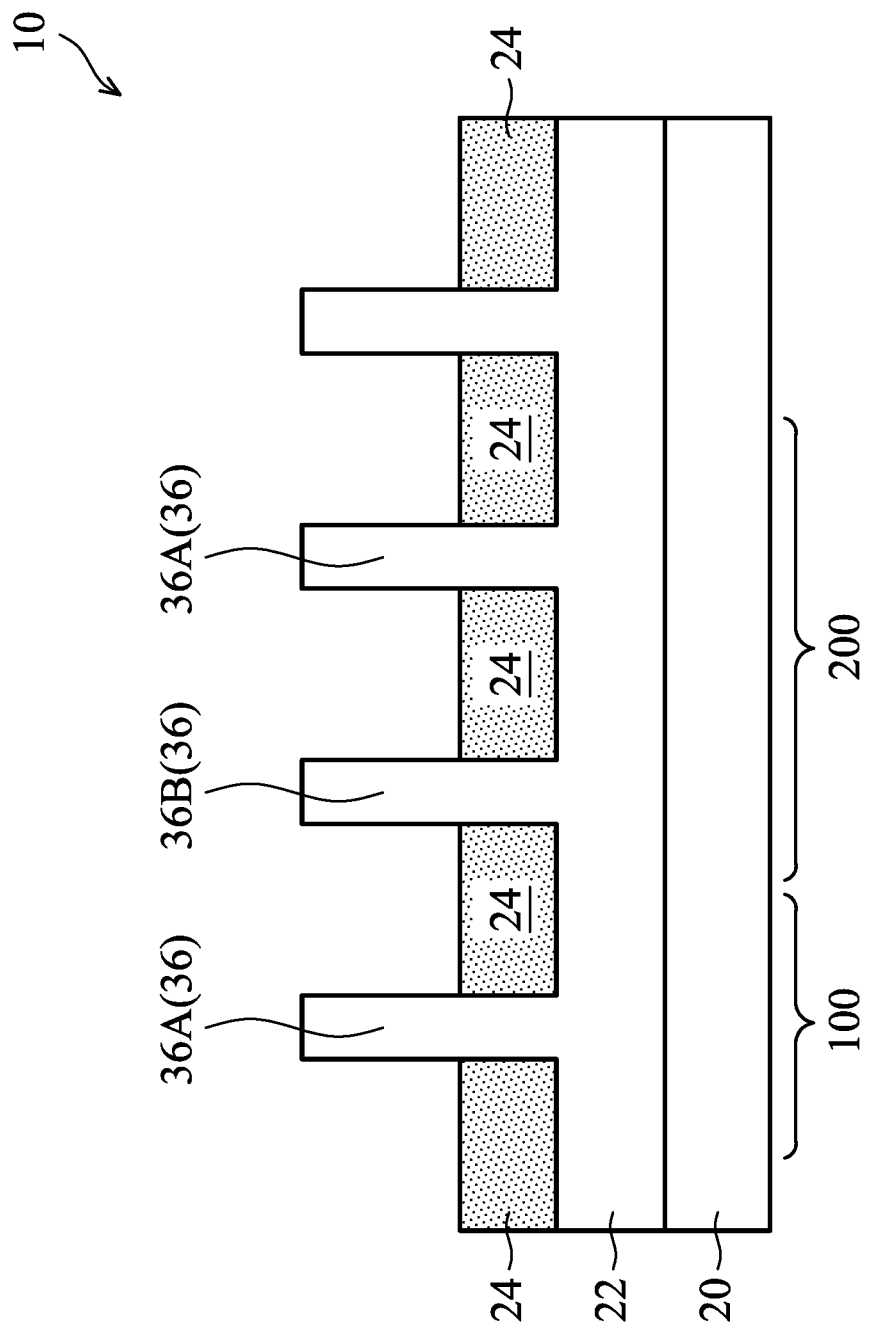

Next, the dummy gate stacks 38 including hard mask layers 44, dummy gate electrodes 42 and dummy gate dielectrics 40 are etched, forming trenches 62 between gate spacers 46, as shown in FIG. 8A. The respective process is illustrated as process 316 in the process flow 300 shown in FIG. 29. The top surfaces and the sidewalls of some portions of protruding fins 36 are exposed to trenches 62. FIG. 8B illustrates the reference cross-section 8B-8B in FIG. 8A.

Figure 9:
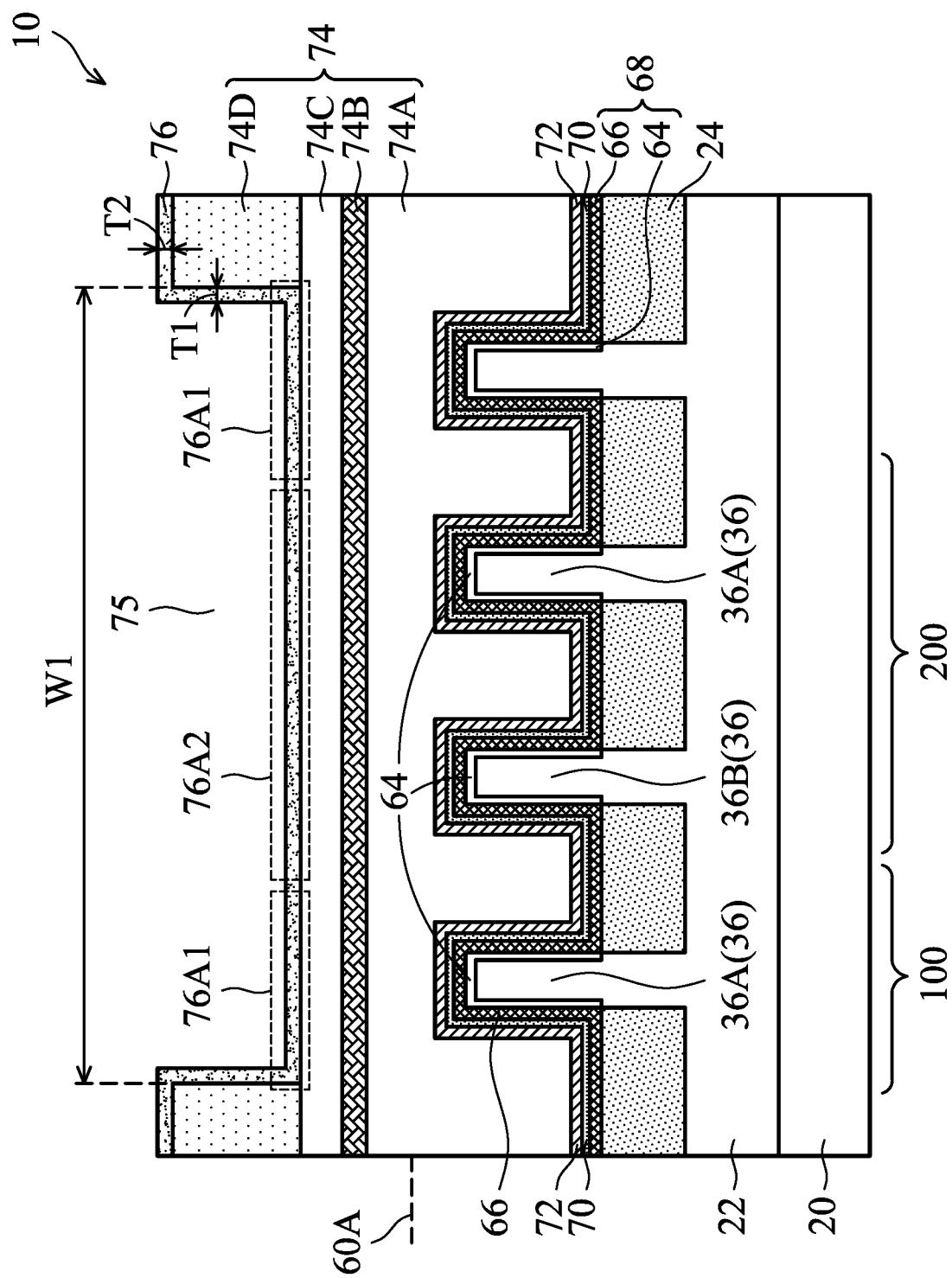

FIGS. 9, 10A, 10B, 10C, and 11-14 illustrate the formation of replacement gate stacks. Referring to FIG. 9, gate dielectric 68 is formed. The respective process is illustrated as process 318 in the process flow 300 shown in FIG. 29. In accordance with some embodiments of the present disclosure, a gate dielectric 68 includes Interfacial Layer (IL) 64 as its lower part. IL 64 is formed on the exposed surfaces of protruding fins 36. IL 64 may include an oxide layer such as a silicon oxide layer, which is formed through the thermal oxidation of protruding fins 36, a chemical oxidation process, or a deposition process. Gate dielectric 68 may also include high-k dielectric layer 66 formed over IL 64. High-k dielectric layer 66 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher. High-k dielectric layer 66 is overlying, and may contact, IL 64. High-k dielectric layer 66 is formed as a conformal layer, and extends on the sidewalls of protruding fins 36 and the top surfaces and the sidewalls of gate spacers 46. In accordance with some embodiments of the present disclosure, high-k dielectric layer 66 is formed using ALD, CVD, PECVD, Molecular-Beam Deposition (MBD), or the like.

In accordance some embodiments, there may be an adhesion layer (which may also be a diffusion barrier layer, not shown) formed over high-k dielectric layer 66. The adhesion layer may be formed of TiN or Titanium Silicon Nitride (TSN).

Lower work-function layer 70 and upper work-function layer 72 are formed over the adhesion layer and gate dielectric 68. The respective process is illustrated as process 320 in the process flow 300 shown in FIG. 29. Work-function layer 72 is also referred to as a target layer or target region since it is the target to be patterned in subsequent processes. In accordance with some embodiments of the present disclosure, work-function layer 70 is an n-work function layer suitable for forming n-type FinFETs, and has a low work function (for example, lower than about 4.5 eV). and work-function layer 72 is a p-work function layer suitable for forming p-type FinFETs, and has a high work function (for example, higher than about 4.6 eV). In accordance with some embodiments of the present disclosure, work-function layer 70 may include a titanium aluminum (TiAl) layer, and work-function layer 72 may include a TaN layer, a TiN layer over the TaN layer, and may or may not include a TiAl layer over the TiN layer. It is appreciated that the work-function layers 70 and 72 may include different materials, which are also contemplated.

Further referring to FIG. 9, a tetra-layer etching mask 74 is formed, which is used for the subsequent patterning of work function layer 72. The respective process is illustrated as process 322 in the process flow 300 shown in FIG. 29. Tetra-layer etching mask 74 includes Bottom Anti-Reflective Coating (BARC) 74A, hard mask 74B, BARC 74C, and photo resist 74D, which are also referred to as a first layer, a second layer, a third layer, and a fourth layer, respectively, of the etching mask 74. In accordance with some embodiments of the present disclosure, BARCs 74A and 74C are formed of cross-linked photo resist. Hard mask 74B may be formed of an oxide (for example, a metal oxide), a nitride (for example, a metal nitride), or the like. For example, hard mask 74B may be formed of aluminum oxide, titanium nitride, or the like. The thickness of BARC 74A may be in the range between about 100 nm and about 200 nm. BARC 74A may fully fill trenches 62 (FIG. 8A), and the top surface of BARC 74A is higher than the top surface 60A (FIG. 9) of ILD 60. The thickness of hard mask 74B may be in the range between about 10 nm and about 20 nm. The thickness of BARC layer 74C may be in the range between about 20 nm and about 40 nm. Photo resist 74D is patterned to form opening 75. In accordance with some embodiments, the patterning of photo resist 74D includes a light exposure process and a development process. The width W1 of opening 75 may be close to or equal to the minimum width that can be achieved using the corresponding lithography process. Width W1 may be in the range between about 50 nm and about 100 nm, depending on the lithography technology. For example, when photo resist 74D is patterned using immersion patterning process adopting 193-nm light, width W1 may be about 50 nm. In accordance with some embodiment, one or more protruding fin 36A and one or more protruding fin 36B are directly underlying opening 75.

Referring back to FIG. 9, polymer layer 76 is deposited, which may be formed using a conformal deposition method such as Chemical Vapor Deposition (CVD), Plasma Enhanced Chemical Vapor Deposition (PECVD), Plasma Enhanced Atomic Layer Deposition (PEALD), or the like. The respective process is illustrated as process 324 in the process flow 300 shown in FIG. 29. Polymer layer 76 is formed as a conformal layer, whose thickness T1 of the vertical portions and the thickness T2 of the horizontal portions are substantially equal to each other, for example, with a variation smaller than about 20 percent. Thicknesses T1 and T2 may be in the range between about 10 nm and about 25 nm. Polymer layer 76 may be formed of elements including, and not limited to, carbon (C), hydrogen (H), nitrogen (N), boron (B), chlorine (Cl), and the like. For example, polymer layer 76 may include $C_xH_y$, $C_xH_yCN$, $NC(CH_2)_xCN$, $C_xH_yNH_2$, $CH_yN_2H_3$, $B_xN_y$, $B_xCl_y$ (with x and y being integers), or combinations thereof.

The precursors used for polymer layer 76 may include $CH_4$, $N_2$, $BCl_3$, or the combinations thereof. Helium (He) may be used as a dilute gas, and may help the plasma ignition and stabilization of the plasma during the deposition of polymer layer 76. In an example deposition process for forming polymer layer 76, the deposition time is in the range between about 10 seconds and 40 seconds, the pressure in the respective reaction chamber is in the range between about 2 mtorr and about 15 mtorr, the power is in the range between about 400 watts and about 700 watts, the flow rate of $CH_4$ is in the range between about 10 sccm and about 50 sccm, and the flow rate of He is in the range between about 20 sccm and about 300 sccm.

Figure 28:
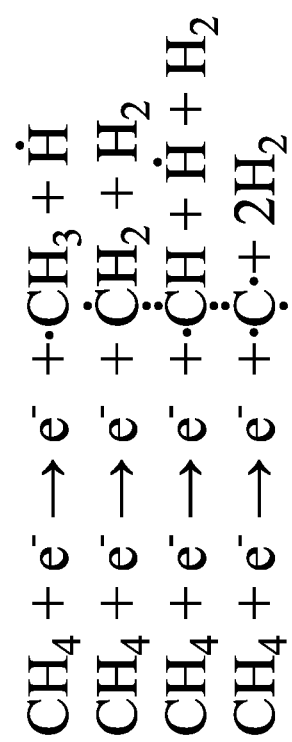
FIG. 28 illustrates the chemical reactions in the deposition of a polymer layer in accordance with some embodiments.

FIG. 28 illustrates the chemical reactions when $CH_4$ is used as the process gas to generate polymer layer 76 (which includes $C_xH_y$). As shown in FIG. 28, $CH_4$ molecules receive the energies from electrons ($e^-$) to generate $CH_3$ and H ions, $CH_2$ and $H_2$, CH, H ions and $H_2$, and/or Carbon ions and $H_2$. These ions, molecules, radicals, etc. react to form $C_xH_y$ polymer.

In accordance with some embodiments of the present disclosure, the precursors include $CH_4$ and $N_2$, and He may be used as the dilute gas and help to ignite and stabilize the plasma. The resultant polymer layer 76 may include $C_xH_yCN$, $NC(CH_2)_xCN$, $C_xH_yNH_2$, $CH_yN_2H_3$, and/or combinations thereof.

In accordance with some embodiments of the present disclosure, the precursors include $BCl_3$ and $N_2$, and He may be used as the dilute gas and help to ignite and stabilize the plasma. The resultant polymer layer 76 may include $B_xN_y$, $B_xCl_y$, and/or combinations thereof.

Figure 10A:
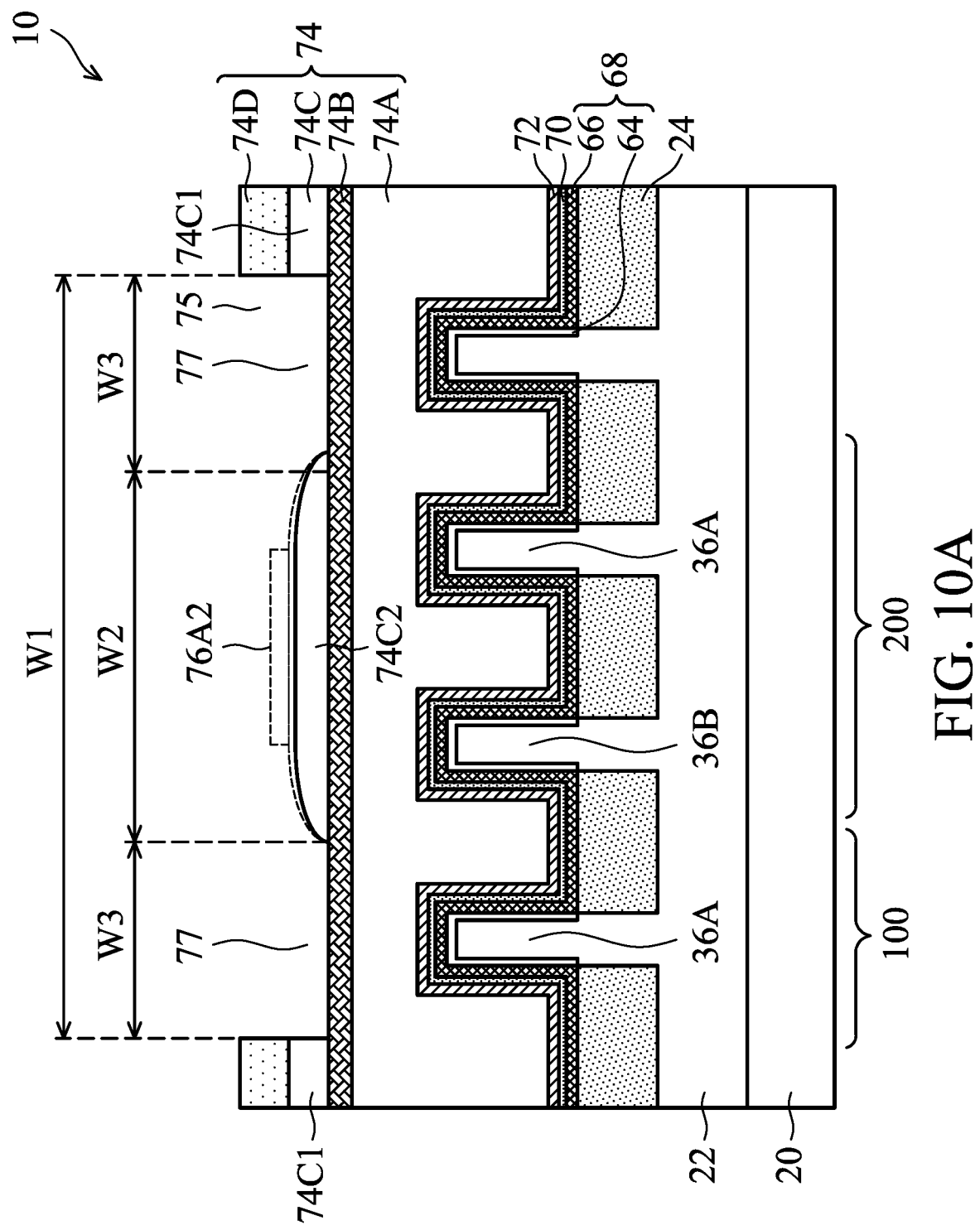

Next, polymer layer 76 and BARC 74C are etched to form openings 77 in BARC 74C (FIG. 10A), during which photo resist 74D is used as an etching mask. The respective process is illustrated as process 326 in the process flow 300 shown in FIG. 29. In the etching process, no etching mask is formed over polymer layer 76 and also extends into opening 75. In the etching process, the portions of polymer layer 76 directly over photo resist 74D are subject to etching, until photo resist 74D is exposed, which is then used as an etching mask to protect the underlying portions of BARC 74C. In the etching process, the horizontal portions 76A1 of polymer layer 76, which portions are at the bottom of opening 75 and close to the sidewalls of photo resist 74D, are etched faster than the portions 76A2, which are at the bottom of opening 75 and close to the center of opening 75. The horizontal portions 76A1 of polymer layer 76 are also etched. Accordingly, after polymer portions 76A1 are fully etched, the underlying portions of BARC 74C are etched, while polymer portions 76A2 still have some portions left, as shown in FIG. 10A. The etching time is controlled so that when the portion of BARC 74C are etched-through, the portions 74C2 of BARC 74C directly under polymer portions 76A2 are still left. Photo resist 74D also has some bottom portions left. Furthermore, when the etching is stopped, polymer layer 76 may be fully removed, or alternatively, there may be some portions 76A2 left, as illustrated by dashed lines in FIG. 10A. Throughout the description, the remaining portions of BARC 74C are referred to as portions 74C1 (which are directly underlying photo resist 74D) and portions 74C2 (which are directly under opening 75). Openings 77 in BARC 74C separate BARC portions 74C1 from BARC portion 74C2.

Figure 10C:
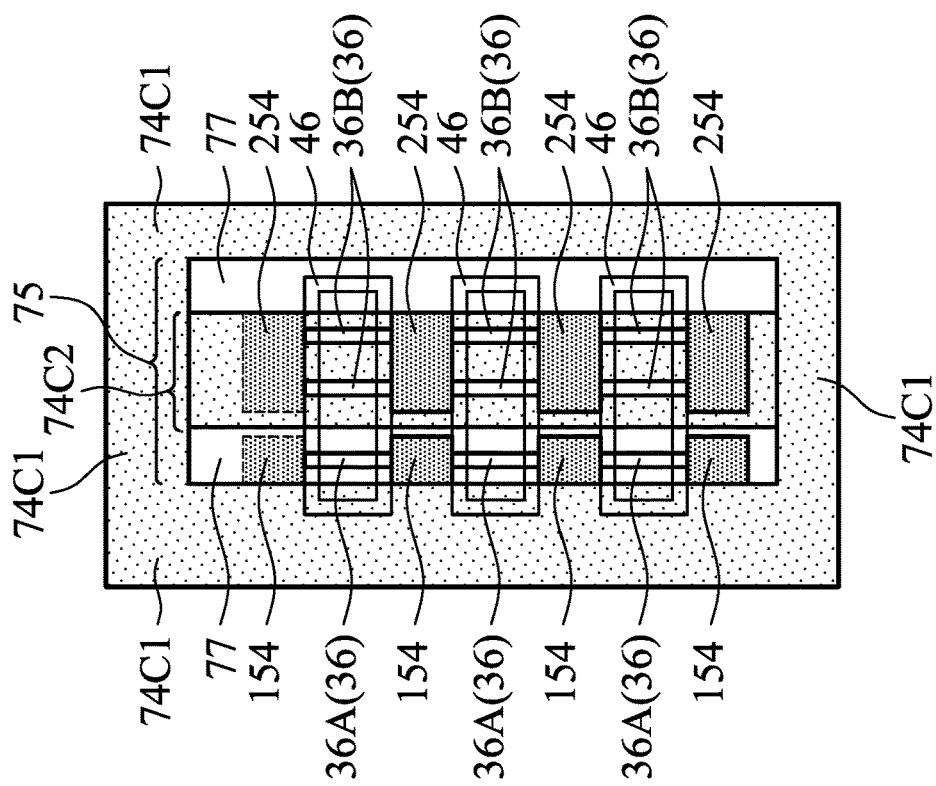
Figure 10B:
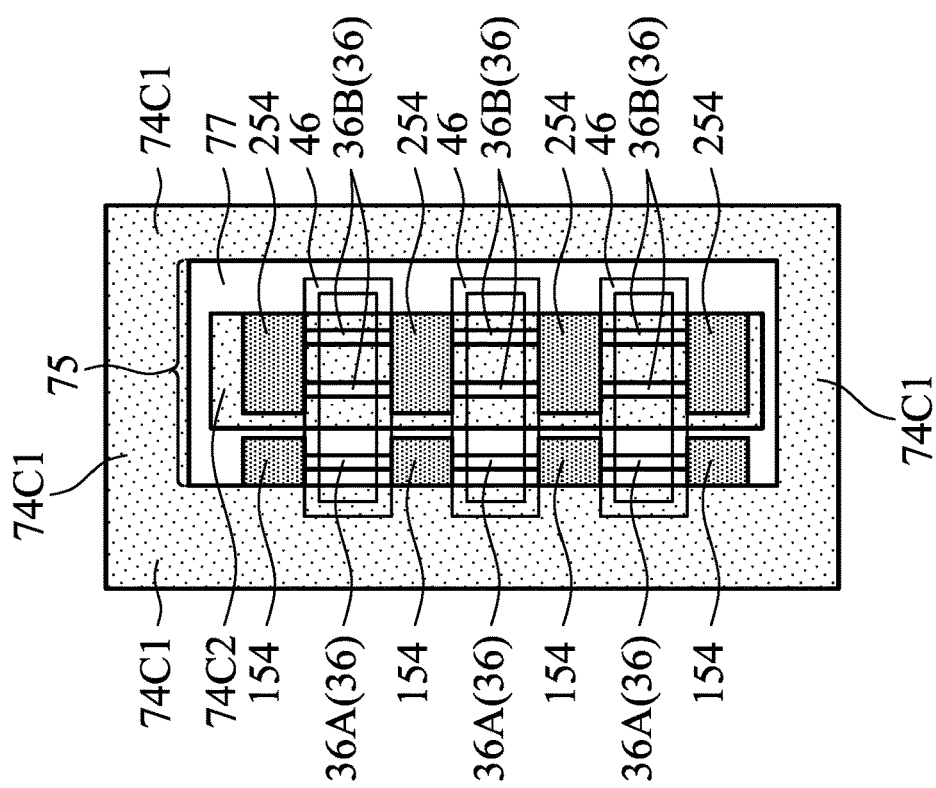
Figure 11:
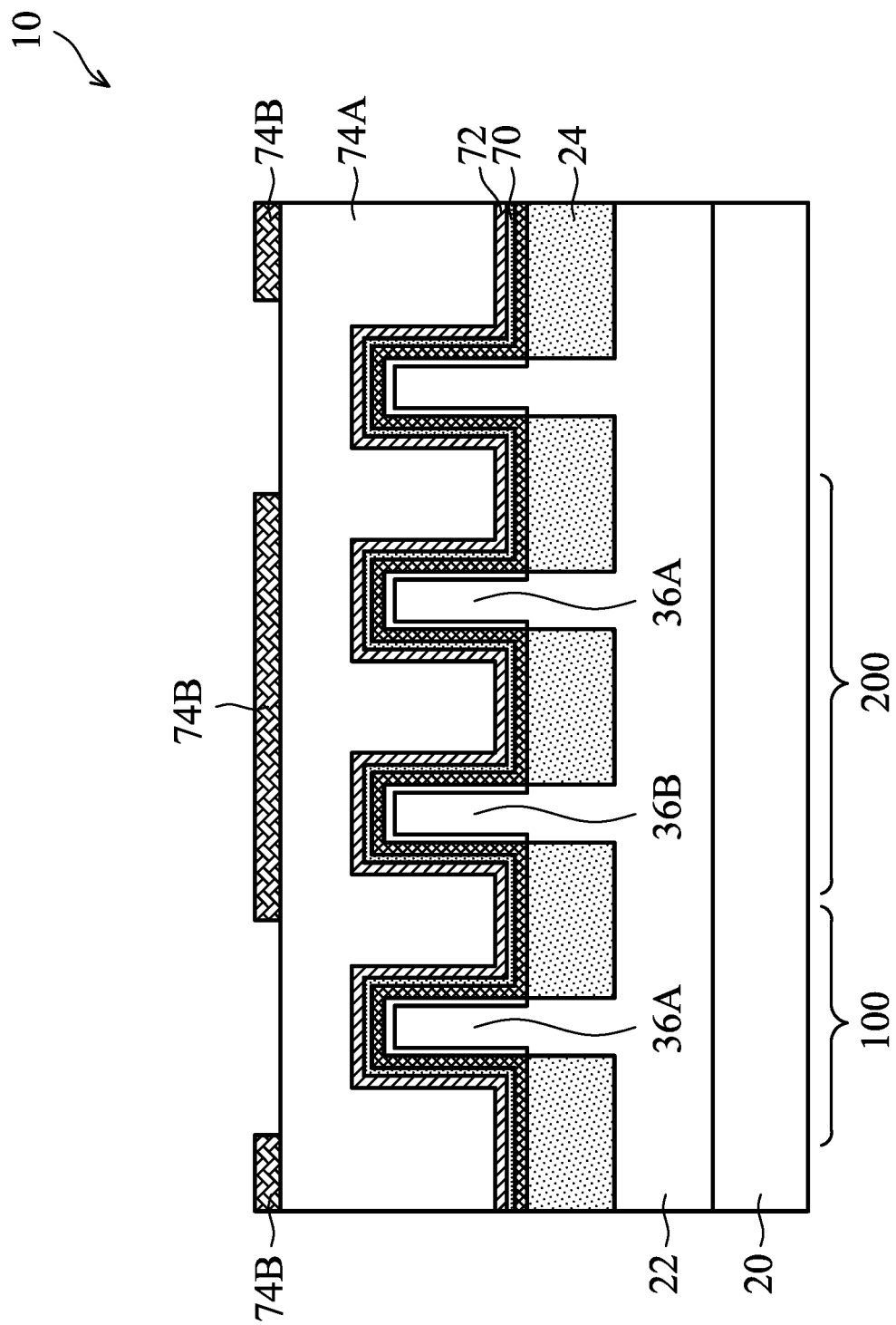

FIGS. 10B and 10C schematically illustrate the plane views of openings 75 and 77 and the underlying features including source/drain regions 154 and 254, gate spacers 46, and protruding fins 36A and 36B in accordance with some embodiments. FIG. 10B illustrates a plane view of the structure shown in FIG. 10A in accordance with some embodiments, wherein BARC portion 74C2 is illustrated as an island, which is encircled by, and is spaced apart from, BARC portion 74C1, opening 77. Protruding fins 36B are covered by BARC portion 74C2, while protruding fin 36A is exposed through BARC 74C.

FIG. 10C illustrates a top view of the structure shown in FIG. 10A in accordance with alternative embodiments, wherein the opposite ends of BARC portions 74C2 are connected to BARC portion 74C1. Openings 77 are formed as two separate strips, each encircled by the remaining portion of BARC 74C.

The etching of polymer layer 76 and BARC 74C may be performed in a same etching process or separate processes. In accordance with some embodiments of the present disclosure, the etching gas includes $N_2$ and $H_2$ based gases and additional gases selected from $CH_4$, $O_2$, He, HBr, Ar, $Cl_2$, and combinations thereof. The duration of the etching process may be in the range between about 20 seconds and about 50 seconds. The pressure in the etching chamber may be in the range between about 5 mtorr and about 15 mtorr. The flow rate of $CH_4$ may be in the range between about 5 sccm and about 50 sccm. The flow rate ratio of the flow rate of $N_2$ to the flow rate of $H_2$ may be in the range between about 1:10 and about 1:1.

Referring back to FIG. 10A, the width W2 of BARC portion 74C2 and the width W3 of openings 77 may be tuned by adjusting the thickness T1 and T2 (FIG. 9) of polymer layer 76. For example, when the thickness of polymer layer 76 is increased (by prolonging the deposition time), the width W2 of BARC portion 74C2 is increased, and width W3 of trenches 77 is reduced. Conversely, when the thickness T1/T2 of polymer layer 76 is reduced (by reducing the deposition time), the width W2 of BARC portion 74C2 is reduced, while width W3 of trenches 77 is increased.

The width W2 of BARC portion 74C2 and the width W3 of openings 77 may also be tuned by adjusting the process parameters in the etching of polymer layer 76. For example, when the etching time is increased, the width W2 of BARC portion 74C2 is reduced, while width W3 of trenches 77 is increased. Conversely, when the etching time is reduced, the width W2 of BARC portion 74C2 is increased, while width W3 of trenches 77 is reduced. Additionally, other etching parameters such as the power also affect the profile and widths W2 and W3, and can be adjusted to achieve the desirable widths W2 and W3.

In accordance with some embodiments of the present disclosure, width W3 of trenches 77 may be reduced to the range between about 20 nm and about 40 nm, which is smaller than a half, and may be in the range between about 25 percent and about 40 percent, of width W1 of the original trench (FIG. 10). Width W2 may be in the range between about 20 percent and about 50 percent of width W1.

The patterned BARC 74C is then used as an etching mask to etch the underlying hard mask 74B. The respective process is illustrated as process 328 in the process flow 300 shown in FIG. 29. The remaining portions of photo resist 74D may be removed prior to etching hard mask 74B, or may be used as a part of the etching mask. After the etching, the remaining portions of photo resist 74D and BARC 74C may be removed, resulting in the structure shown in FIG. 11. In accordance with some embodiments in which hard mask 74B comprises aluminum oxide, the etching gas may include chlorine-based gases such as $BCl_3/Cl_2$, and additional gases selected from He, $CH_4$, HBr, Ar, and combinations thereof.

Figure 12:
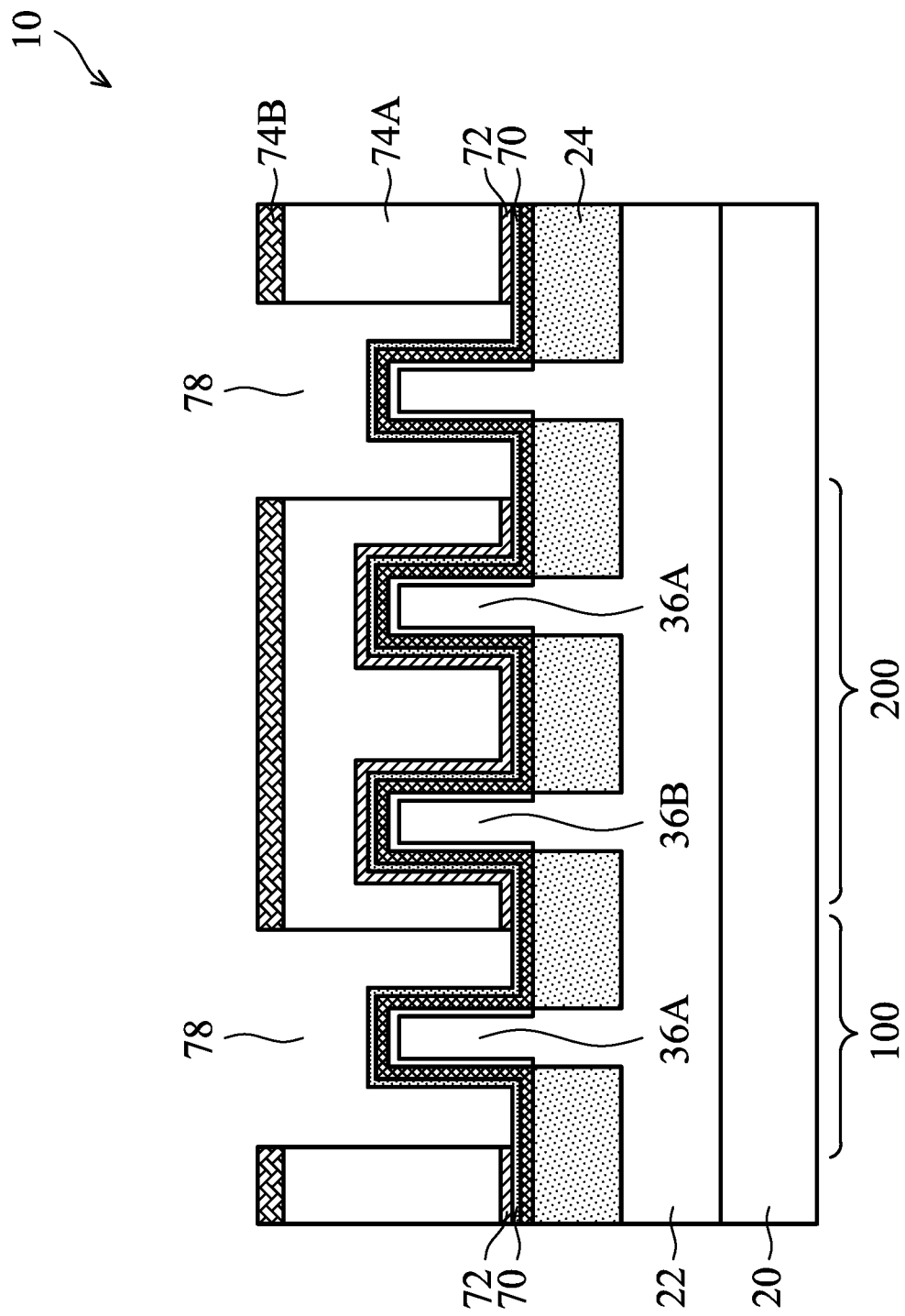

In a subsequent process, as shown in FIG. 12, BARC 74A is patterned in an etching process using the patterned hard mask 74B as the etching mask. The respective process is illustrated as process 330 in the process flow 300 shown in FIG. 29. In accordance with some embodiments of the present disclosure, the etching gas of BARC 74A may include $N_2$ and $H_2$ based gases and additional gases selected from $CH_4$, $O_2$, He, HBr, Ar, and combinations thereof. The power and other etching conditions for etching BARC 74C, hard mask 74B, and BARC 74A may be different from each other.

Figure 13:
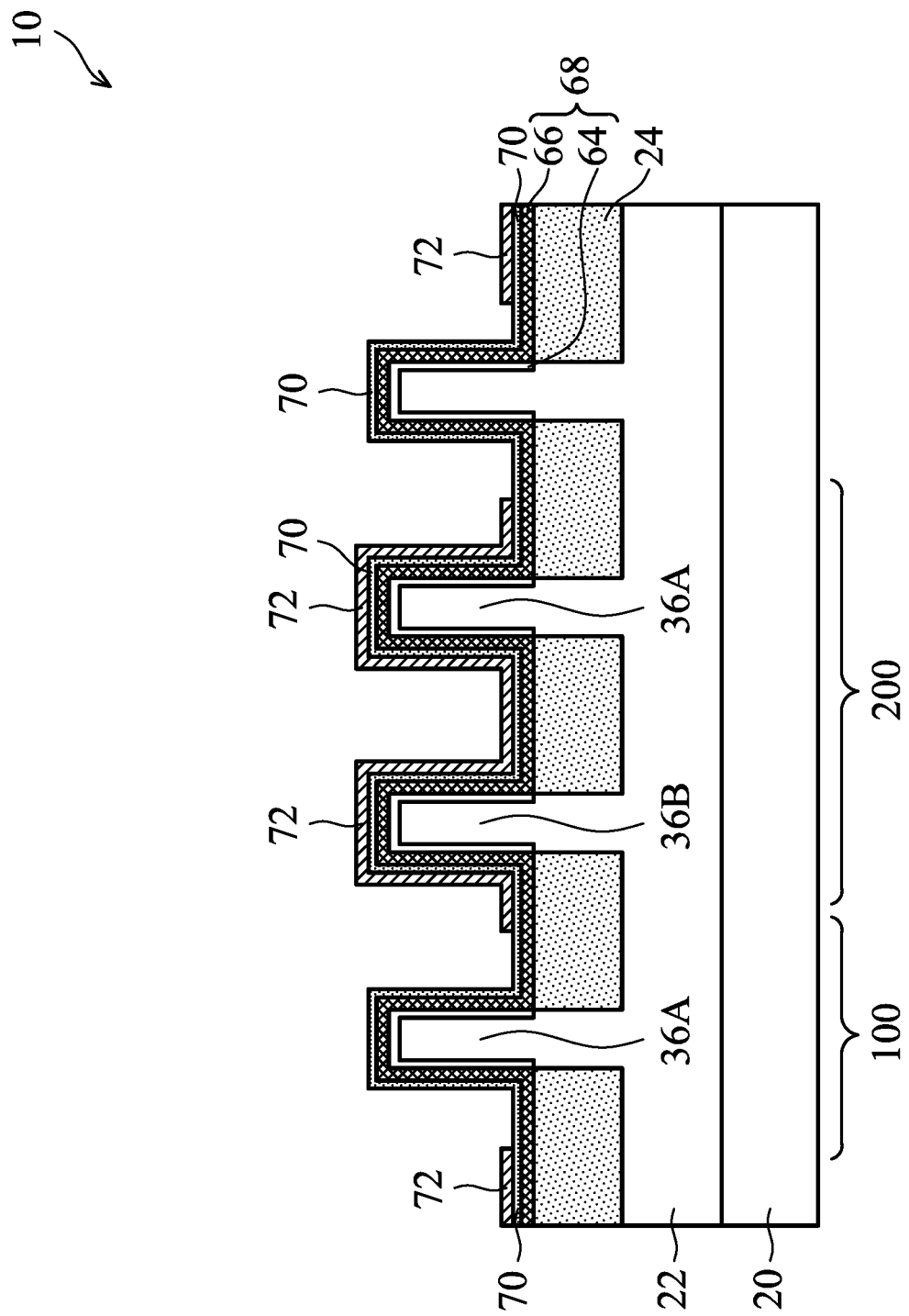

Next, in device region 100, upper work-function layer 72 is etched through openings 78 in BARC 74A, revealing the underlying work-function layer 70. In device region 200, upper work-function layer 72 is protected by hard mask 74B and BARC 74A. The respective process is illustrated as process 332 in the process flow 300 shown in FIG. 29. The etching is performed by selecting an etching gas or a chemical solution that attacks work-function layer 72, but does not attach work-function layer 70. After the etching, hard mask 74B and BARC 74A are removed, and the resulting structure is shown in FIG. 13, in which work-function layer 70 is exposed in device region 100, and work-function layer 72 is exposed in device region 200.

Figure 14:
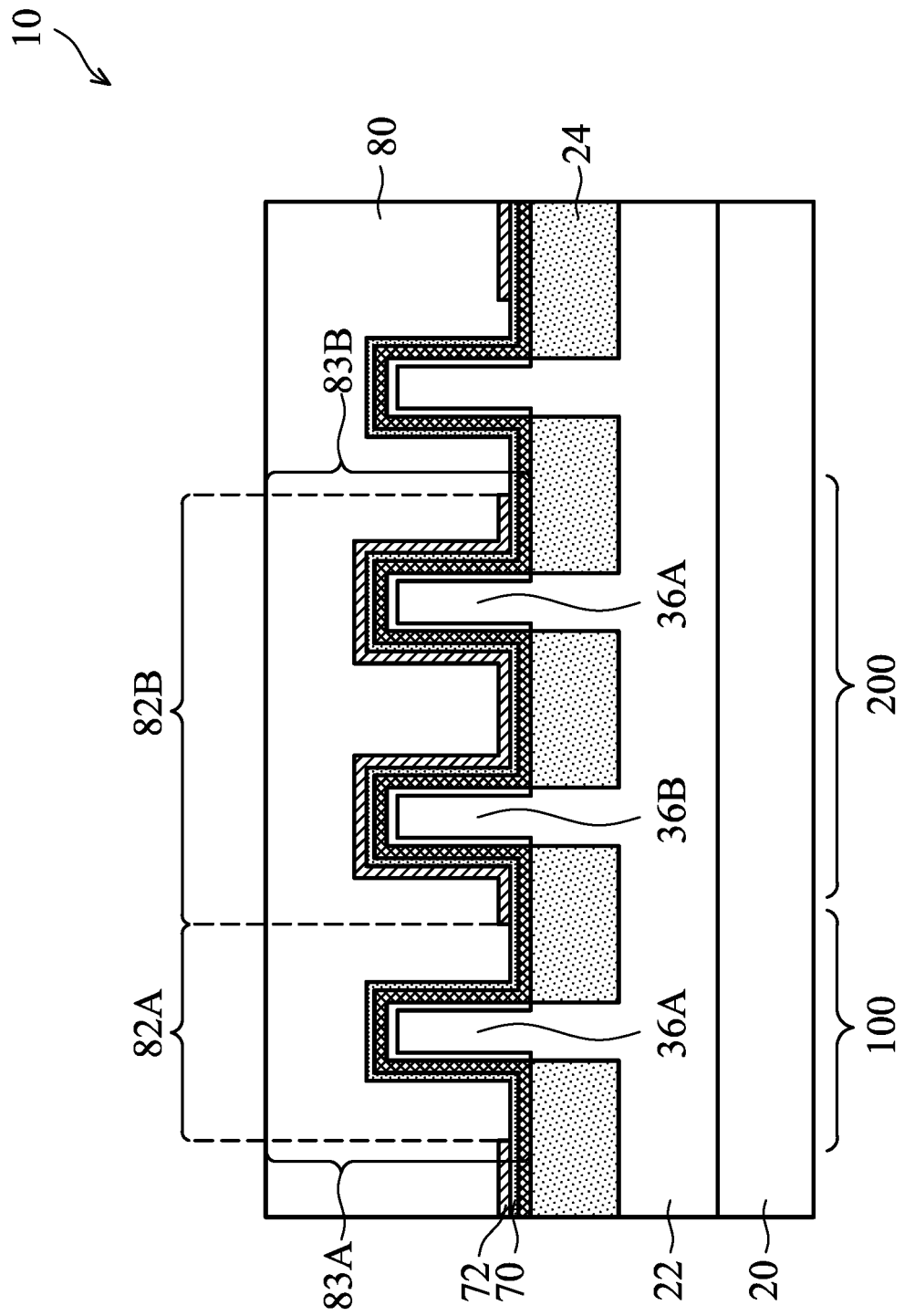

Referring to FIG. 14, stacked conductive layers 80 are formed. The respective process is illustrated as process 334 in the process flow 300 shown in FIG. 29. Conductive layers 80 may include a metal capping layer and a conductive gap-filling layer over the metal capping layer. For example, the metal capping layer may be formed of TiN, and the conductive gap-filling layer may include cobalt, tungsten, or the like. After the formation of the conductive gap-filling layer, a planarization process may be performed to remove excess portions of the deposited layers. In the resulting structure, stacked layers 80 and the underlying work-function layer 70 in combination form parts of the gate electrode 83A of the FinFET 82A in device region loft Stacked layers 80 and the underlying work-function layers 72 and 70 in combination form parts of the gate electrode 83B of the FinFET 82B in device region 200. In accordance with some embodiments of the present disclosure, work-function layer 70 is an n-work function layer, and FinFET 82A is an n-type FinFET, and work-function layer 72 is a p-work function layer, and FinFET 82B is a p-type FinFET. In the illustrated example, the gate electrodes of FinFETs 82A and 82B are interconnected, and may be used for forming circuits such as an inverter.

Figure 15:
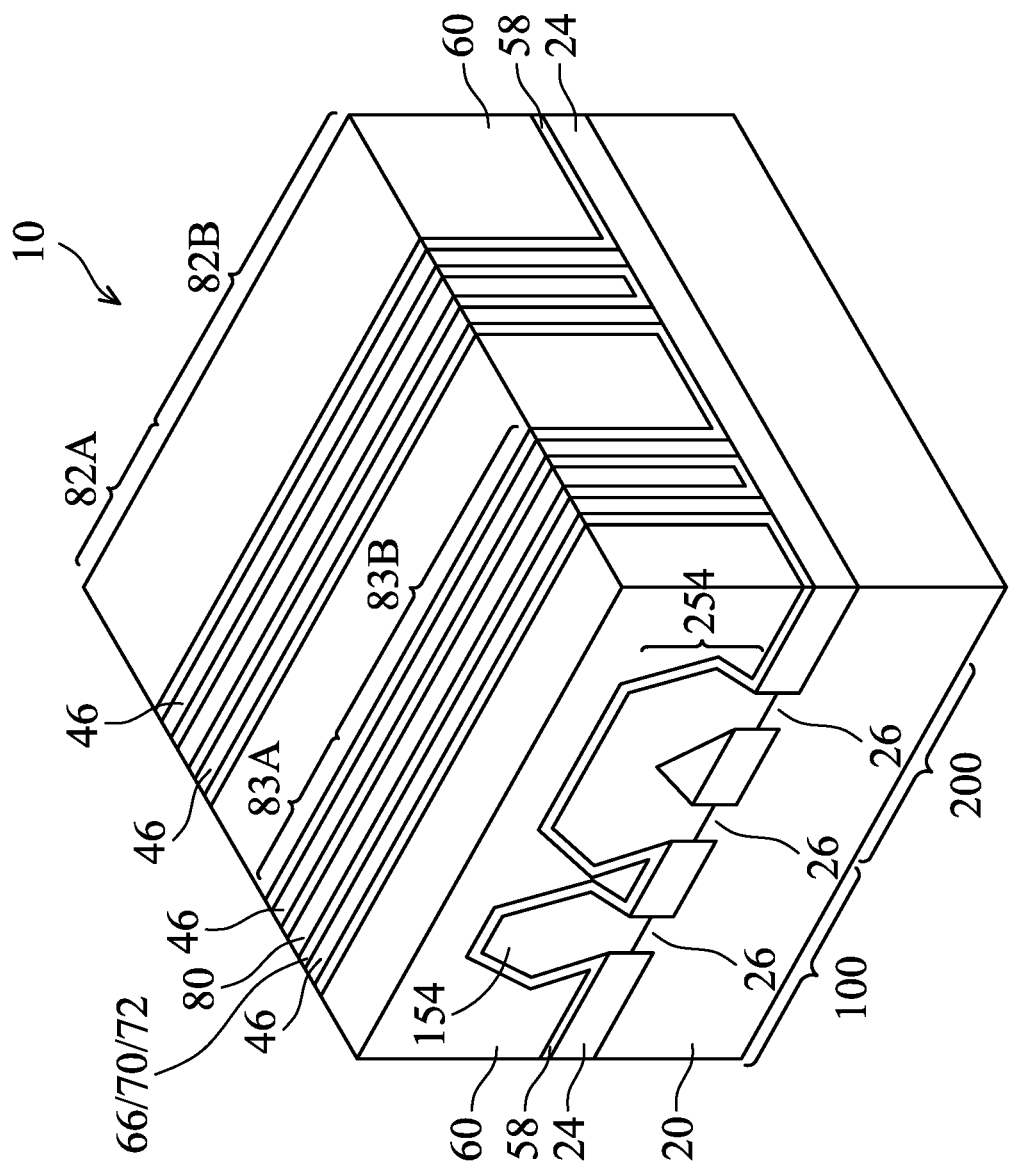
Figure 16:
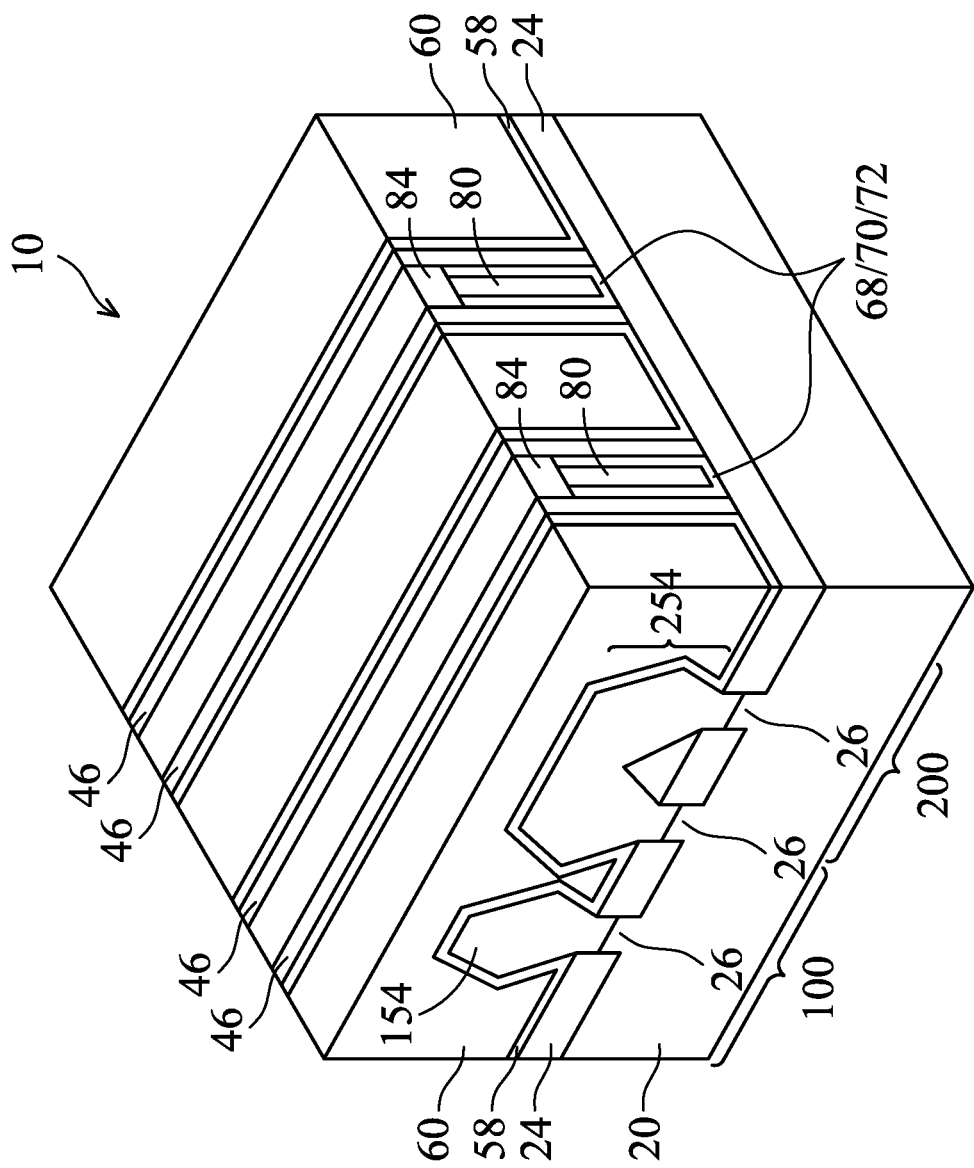

FIG. 15 illustrates a perspective view of FinFETs 82A and 82B. FIG. 16 illustrates the formation of hard masks 84 in accordance with some embodiments. The formation of hard masks 84 may include performing an etching process to recess gate stacks 83A and 83B (which are metal gates), so that recesses are formed between gate spacers 46, filling the recesses with a dielectric material, and then performing a planarization process to remove excess portions of the dielectric material. Hard masks 84 may be formed of silicon nitride, silicon oxynitride, silicon oxy-carbo-nitride, or the like. In accordance with some embodiments, gate stacks (including 83A and 83B) may be formed as long strips, which are then cut apart. For example, gate stacks 83 and 84 may belong to a same gate strip, and an opening may be formed by etching a portion of the gate strip between gate stacks 83A and 83B, and then filling the respective opening with a dielectric material to form a dielectric isolation region, which electrically disconnects gate stacks 83A and 83B from each other. The hard masks 84 may be formed before or after the formation of the dielectric isolation region. In accordance with alternative embodiments, no hard mask (84) is formed.

Figure 17:
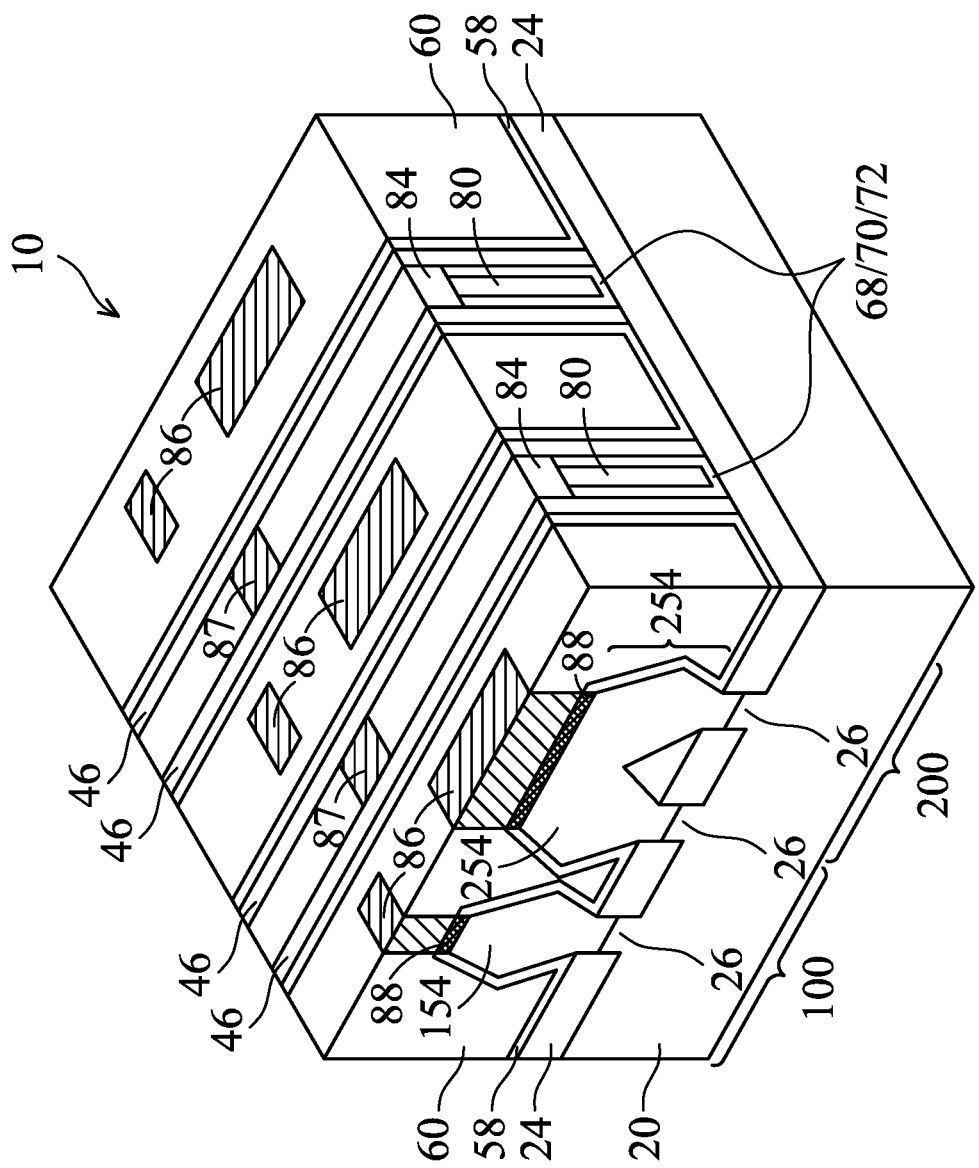

FIG. 17 illustrates the formation of source/drain contact plugs 86 and silicide regions 88. Gate contact plugs 87 are also formed to penetrate through a portion of each of hard masks 84 to contact the gate electrodes 83A and 83B (FIG. 14). The details of the formation processes are not repeated herein.

FIGS. 18 through 22 illustrate cross-sectional views of intermediate stages in a fin-cut process in accordance with some embodiments of the present disclosure. Unless specified otherwise, the materials and the formation processes of the components in these embodiments are essentially the same as the like components, which are denoted by like reference numerals in the example embodiments shown in the preceding FIGS. 1-7, 8A, 8B, 9, 10A, 10B, 10C, and 11-17. The details regarding the formation process and the materials of the components shown in FIGS. 18 through 22 (and FIGS. 23 through 27) may thus be found in the discussion of the embodiments shown in the preceding figures.

Figure 18:
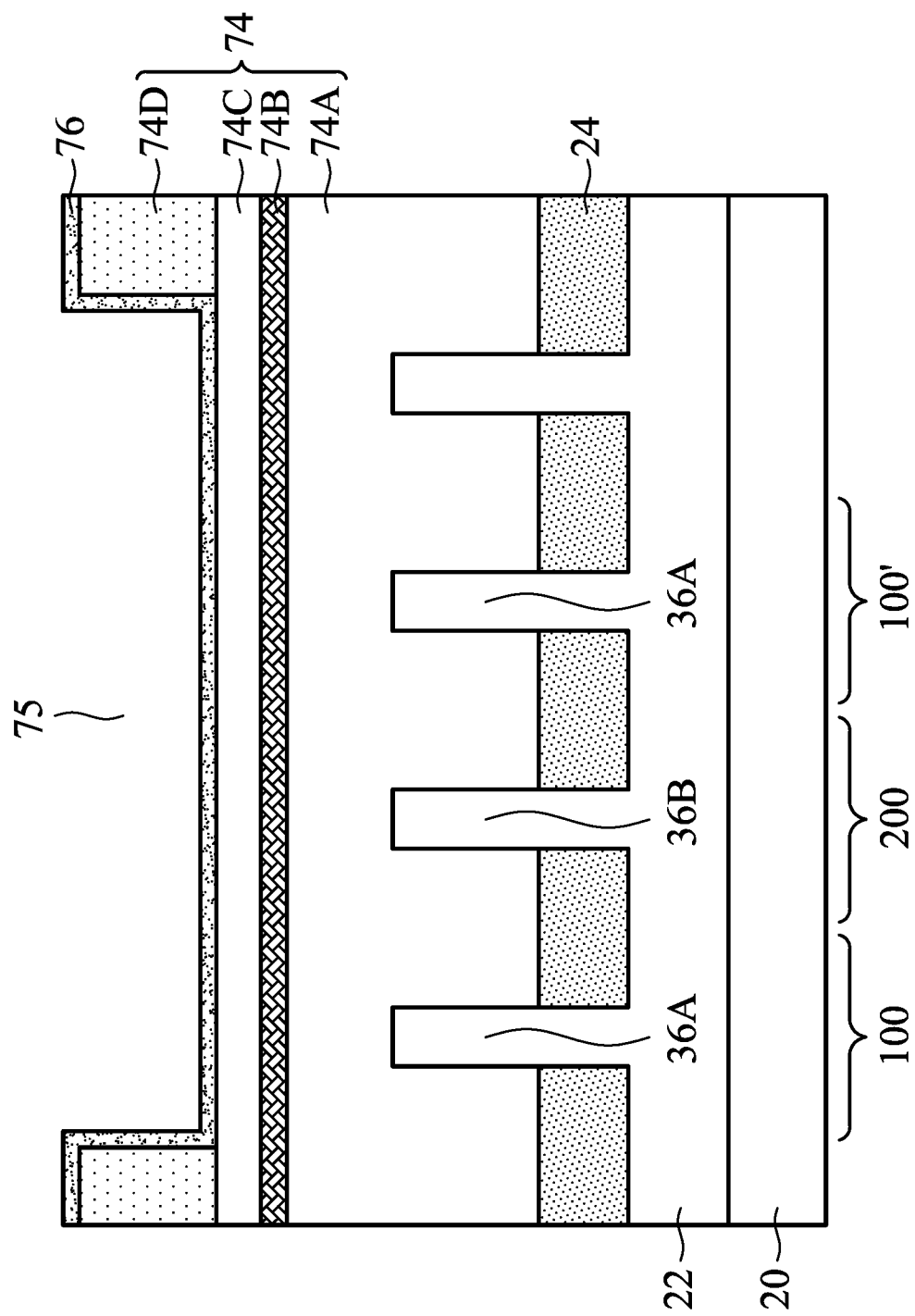
FIGS. 18 through 22 illustrate the cross-sectional views of intermediate stages in a fin-cut process in accordance with some embodiments.

The initial steps of these embodiments are essentially the same as shown in FIGS. 1 through 3. FIG. 18 illustrates a cross-sectional view of the structure shown in FIG. 3, with tetra-layer etching mask 74 added. Tetra-layer etching mask 74 includes BARC 74A, hard mask 74B, BARC 74C, and the patterned photo resist 74D. Opening 75 is formed in the patterned photo resist 74D. Polymer layer 76 is deposited. The details of the materials, the dimensions, and the formation processes and the like of tetra-layer etching mask 74 and polymer layer 76 may be found referring to the embodiments in FIG. 9. Opening 75 is directly over protruding fin 36B and protruding fins 36A that are on opposite sides of protruding fin 36B.

Figure 19:
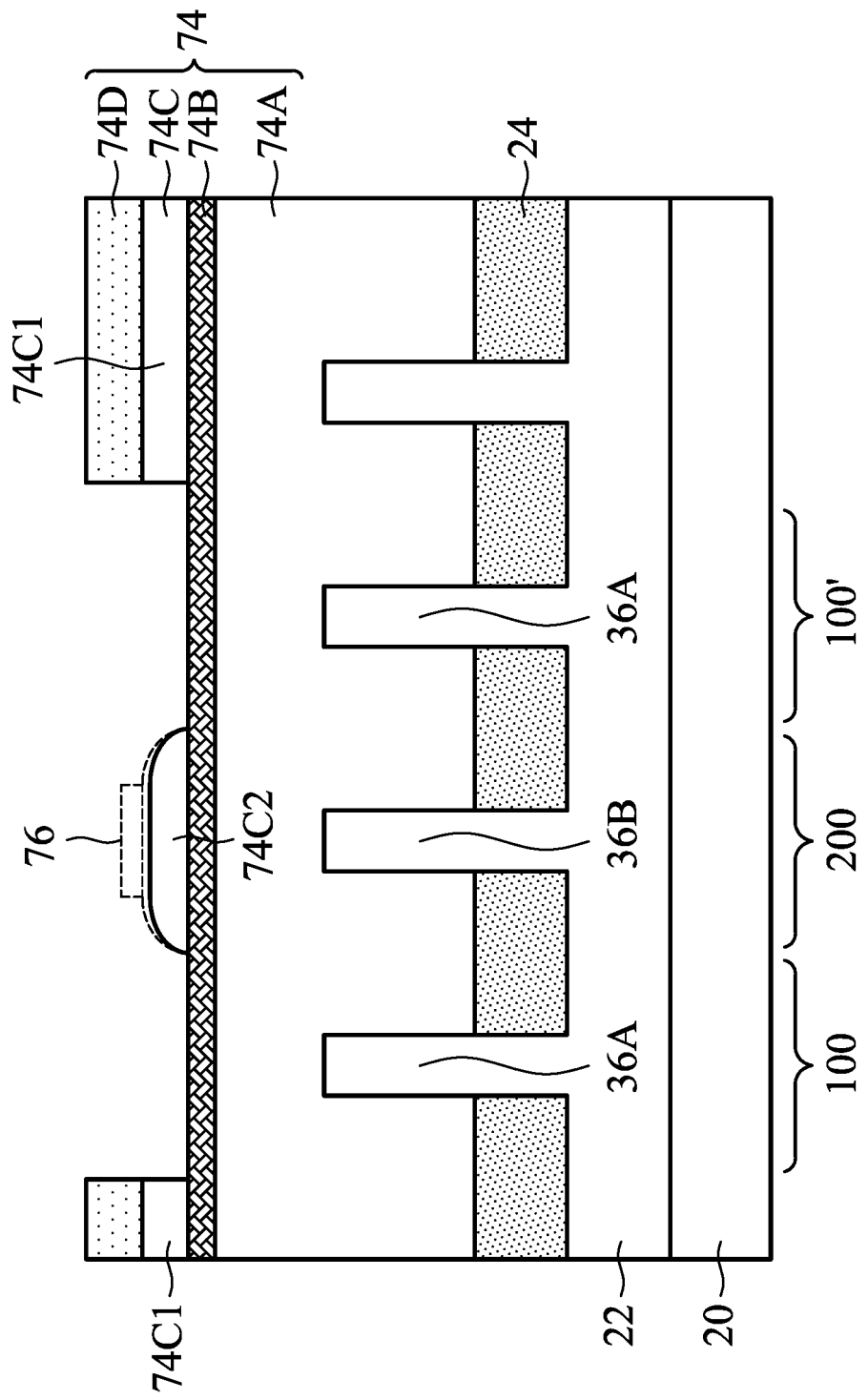
Figure 20:
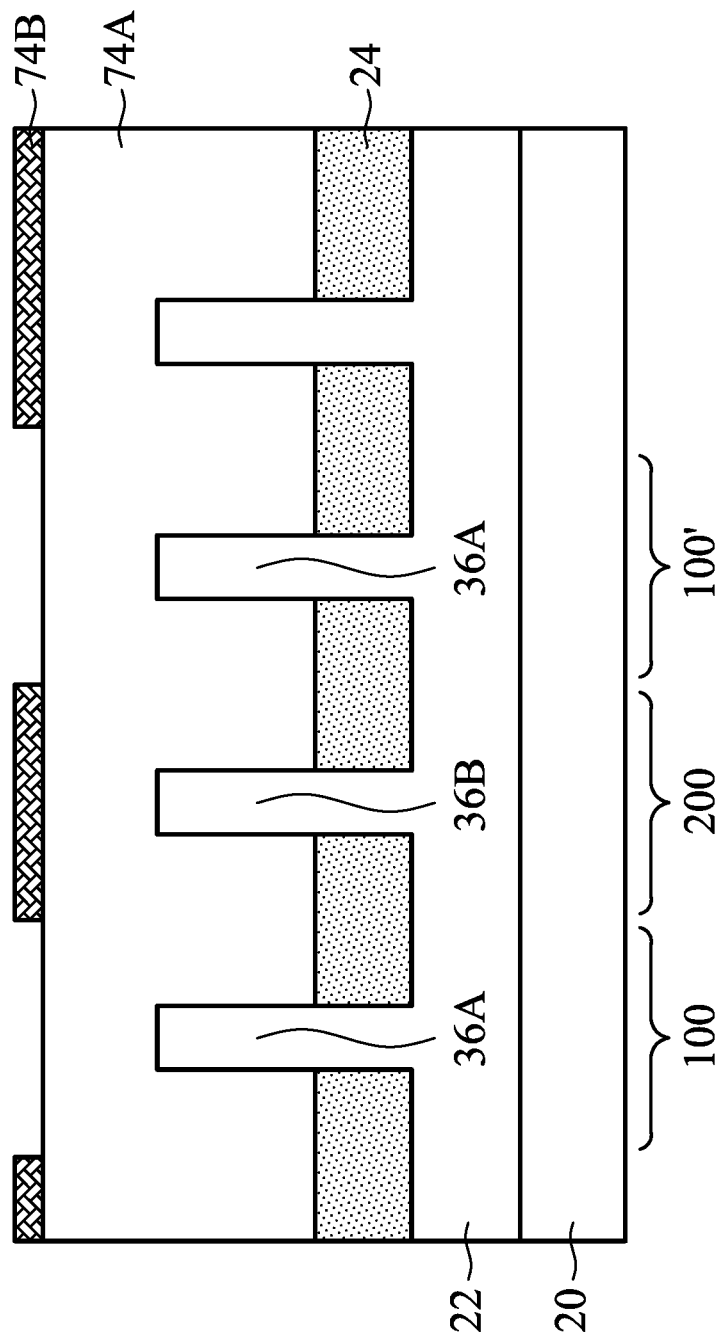
Figure 21:
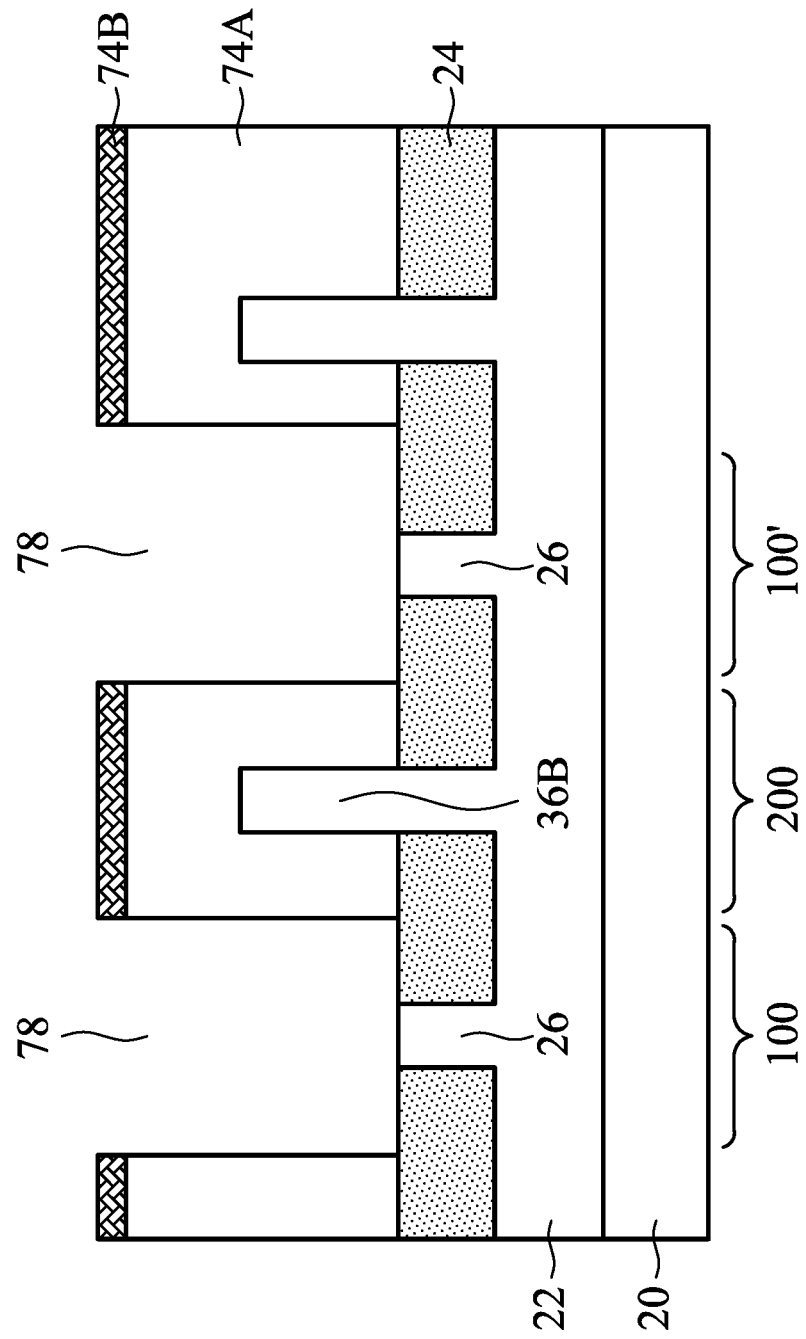
Figure 22:
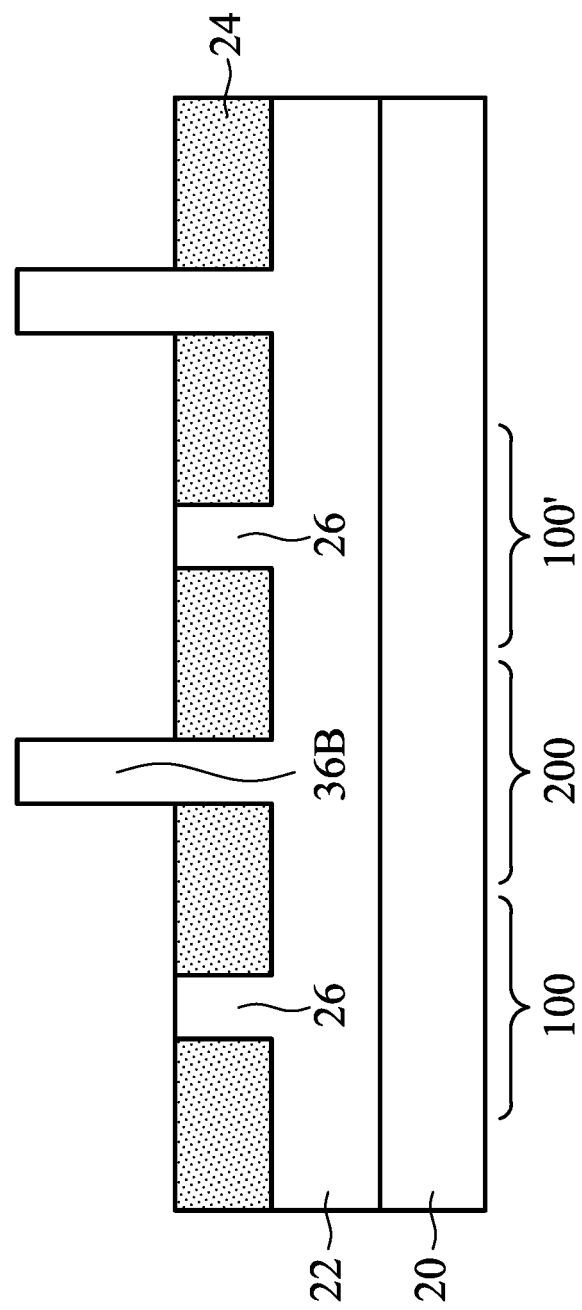

Polymer layer 76 and BARC 74C are then etched, and the resulting BARC portions 74C1 and 74C2 are illustrated in FIG. 19. Next, the patterned BARC 74C is used as an etching mask to etch hard mask 74B, and the resulting patterned hard mask 74B is shown in FIG. 20. BARC 74A is then patterned using the patterned hard mask 74B as an etching mask, exposing the underlying protruding fins 36A, while protruding fin 36B is protected by BARC 74A. The exposed protruding fins 36A are also referred to as a target layer or regions. The protruding fins 36A are then cut in an etching process, resulting in the structure shown in FIG. 21. BARC 74A and hard mask 74B may then be removed, as shown in FIG. 22. In subsequent processes, some or all of the processes shown in FIGS. 4-7, 8A, 8B, 9, 10A, 10B, 10C, and 11-17 may be performed to form FinFETs.

Figure 23:
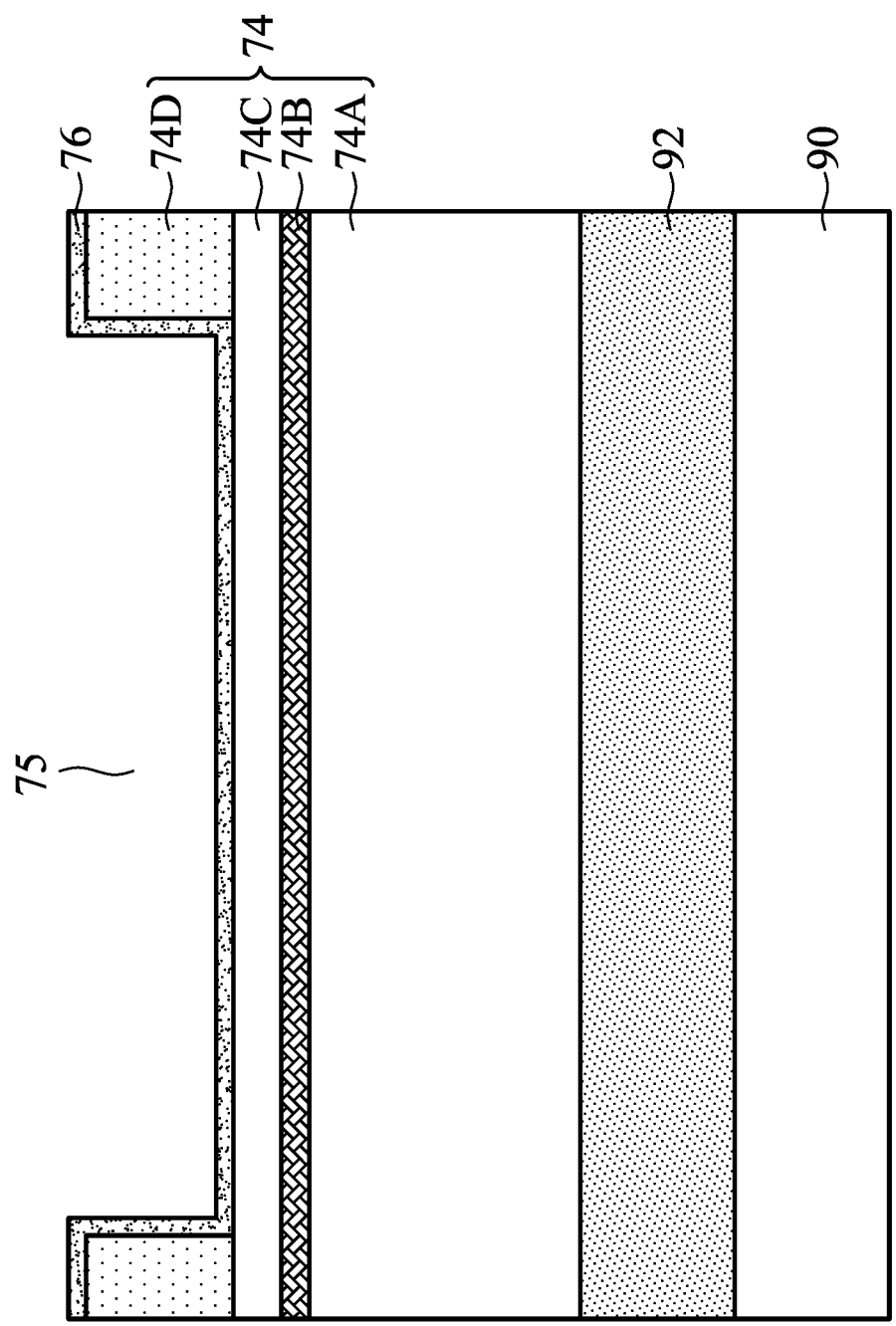
FIGS. 23 through 27 illustrate the cross-sectional views of intermediate stages in the formation of conductive features in a dielectric layer in accordance with some embodiments.

FIGS. 23 through 27 illustrate the intermediate stages in a damascene process for forming closely located conductive features such as metal lines. In FIG. 23, dielectric layer 92 (also a target layer or region in this embodiment) is formed over base structure 90. Base structure 90 may include a semiconductor substrate and devices such as transistors, dielectric layers, metal lines, or the like over the semiconductor substrate. Dielectric layer 92 may be formed of silicon oxide, silicon nitride, a low-k dielectric material, or the like. Tetra-layer etching mask 74, which includes BARC 74A, hard mask 74B, BARC 74C, and the patterned photo resist 74D are formed over dielectric layer 92. Polymer layer 76 is then deposited. The details of the materials, the dimensions, and the formation processes and the like of tetra-layer etching mask 74 and polymer layer 76 may be found referring to the embodiments shown in FIG. 9.

Figure 24:
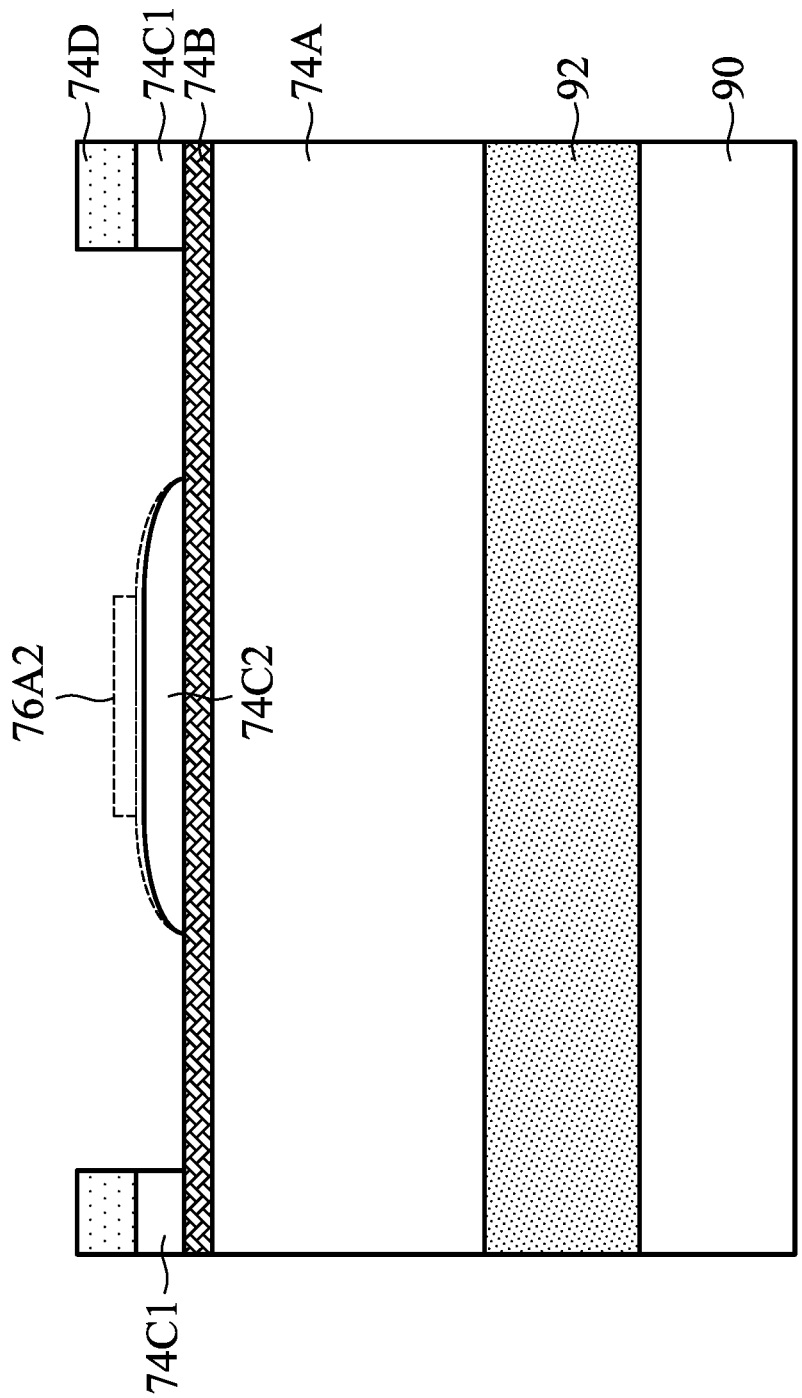
Figure 25:
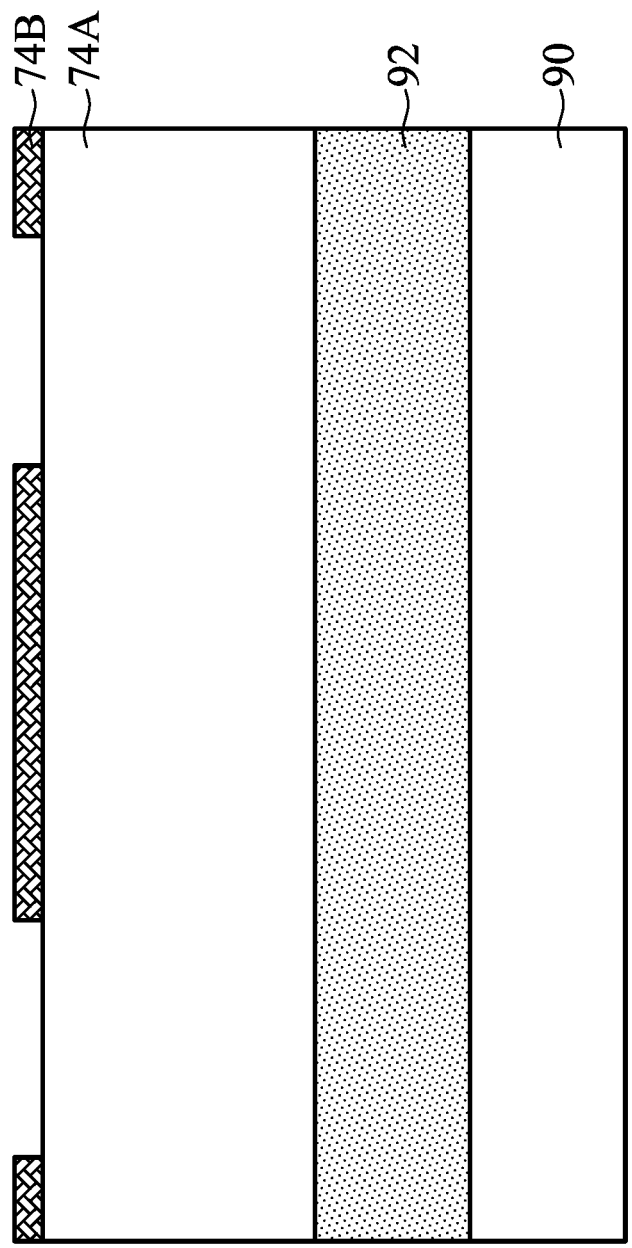
Figure 26:
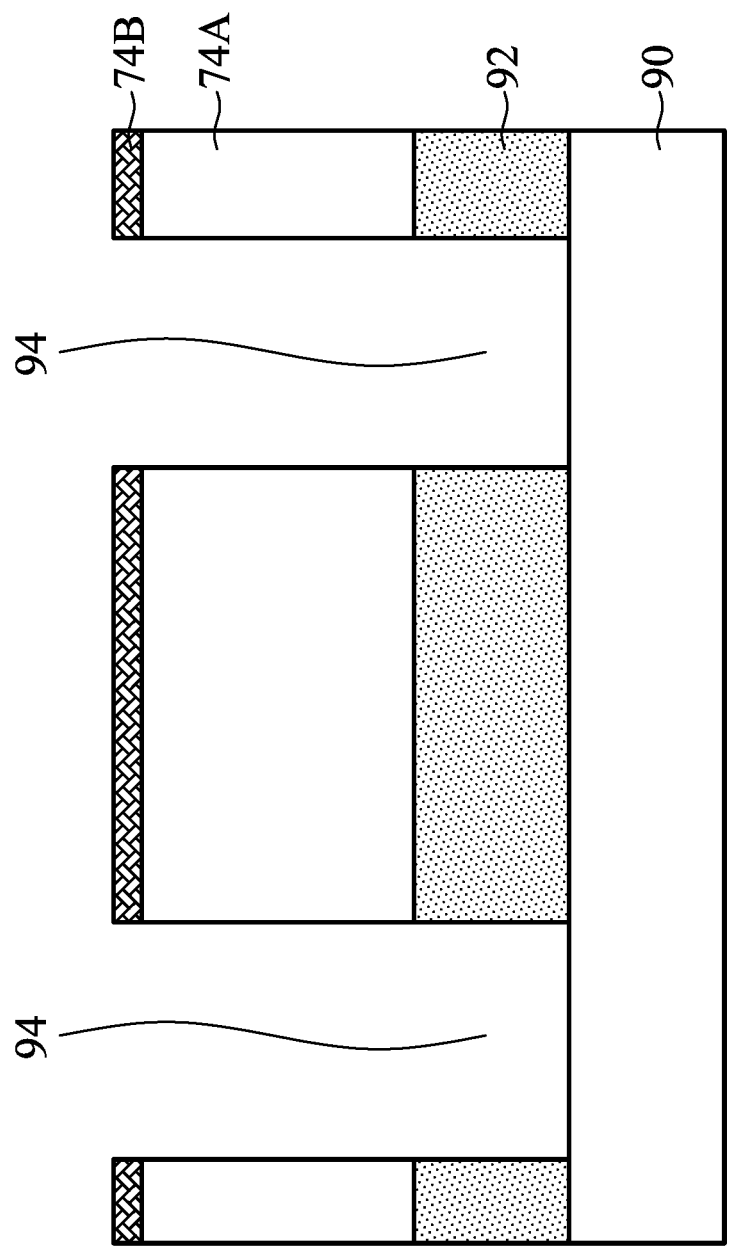
Figure 27:
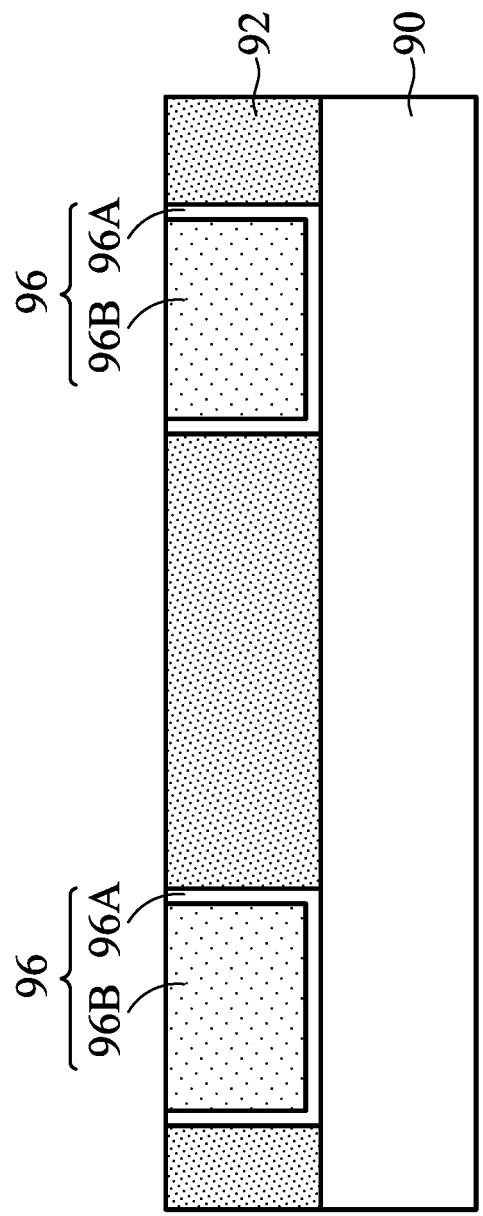

Polymer layer 76 and BARC 74C are then etched, and the resulting BARC portions 74C1 and 74C2 are illustrated in FIG. 24. Next, the patterned BARC 74C is used as an etching mask to etch hard mask 74B, and the resulting patterned hard mask 74B is shown in FIG. 25. Next, BARC 74A is patterned using the patterned hard mask 74B as an etching mask, exposing the underlying dielectric layer 92. Dielectric layer 92 is then etched in an etching process, resulting in openings 94 to be formed in dielectric layer 92, as shown in FIG. 26. BARC 74A and hard mask 74B may then be removed. Conductive material may be filled into openings 94 to form conductive features 96 (FIG. 27), which may include diffusion barrier layers 96A and metal regions 96B. Diffusion barrier layers 96A may be formed of titanium, titanium nitride, tantalum, tantalum nitride, or the like. Metal regions 96B may be formed of copper or a copper alloy.

The embodiments of the present disclosure have some advantageous features. By utilizing the etching rate difference between different portions of the BARCs, and further through adjusting process parameters and depositing an additional polymer layer, the widths and the pitches of the formed features may be reduced by more than a half. The embodiments of the present disclosure may be applied on any patterning process in which tetra-layer etching masks are adopted, so that the widths and the pitches of the features to be formed may be reduced to be lower than the limit of the lithography processes. For example, the etching of dielectric layers for forming metal lines, the etching of semiconductor substrate for forming narrow STI regions, the etching of dielectric layers for forming dielectric lines, and the like, may adopt the embodiments of the present disclosure.

In accordance with some embodiments of the present disclosure, a method includes forming a tetra-layer etching mask over a target layer, wherein the tetra-layer etching mask includes a first BARC; a hard mask over the first BARC; a second BARC over the hard mask; and a photo resist over the second BARC; patterning the photo resist to form an opening, wherein a top surface of the second BARC is exposed to the opening, and the top surface is a top surface of a first portion and a second portion of the second BARC; forming a polymer layer on the photo resist, wherein the polymer layer comprises a higher portion directly over the photo resist, and a lower portion extending into the opening to contact the top surface of the first portion of the second BARC; etching the polymer layer and the second BARC, wherein the first portion of the second BARC is removed in the etching, and the second portion of the second BARC remains after the etching; etching the hard mask using the second BARC as an etching mask; etching the first BARC; and etching the target layer. In an embodiment, the forming the polymer layer comprises forming a conformal layer. In an embodiment, after the etching the second BARO, the second BARC further comprises a third portion encircling the second portion, and the second portion is spaced apart from opposite sidewalls of the third portion of the second BARC. In an embodiment, the second portion is fully separated from the third portion of the second BARC. In an embodiment, the second portion has opposite ends connected to the third portion of the second BARC. In an embodiment, the opening has a first width, and the second portion has a second width in a range between about 25 percent and about 40 percent of the first width. In an embodiment, the etching the target layer comprises etching a work-function layer of a gate electrode of a transistor. In an embodiment, the etching the target layer comprises etching a semiconductor fin. In an embodiment, the etching the target layer comprises etching a dielectric layer to form an opening, and the method further comprises forming a conductive feature to fill the opening.

In accordance with some embodiments of the present disclosure, a method includes forming a polymer layer on a patterned photo resist, wherein the polymer layer extends into an opening in the patterned photo resist; etching the polymer layer to expose the patterned photo resist; etching the polymer layer and a top BARC to pattern the top BARC, wherein the patterned photo resist is used as an etching mask; and using the top BARC as an etching mask to etching an underlying layer. In an embodiment, the etching the underlying layer comprises: etching a hard mask underlying the top BARC; and etching a bottom BARC underlying the hard mask. In an embodiment, the polymer layer comprises a first portion over the patterned photo resist, and a second portion in the opening and contacting the top BARC. In an embodiment, the first portion and the second portion of the polymer layer have substantially a same depth. In an embodiment, the polymer layer comprises an element selected from the group consisting of carbon, hydrogen, nitrogen, boron, chlorine, and combinations thereof. In an embodiment, the polymer layer and the top BARC are etched using $N_2$, $H_2$, and $CH_4$.

In accordance with some embodiments of the present disclosure, a method includes forming a tetra-layer etching mask over a target layer, wherein the tetra-layer etching mask includes a first BARC; a hard mask over the first BARC; a second BARC over the hard mask; and a photo resist over the second BARC; patterning the photo resist to form an opening; and etching the second BARC, the hard mask, and the first BARC, with the patterned photo resist being used as a portion of an etching mask, wherein after the etching, two openings are formed in the second BARC, with the two openings being separated apart from each other by a remaining portion of the second BARC, and the two openings and the remaining portion of the second BARC in combination have a width substantially equal to a corresponding width of the opening in the photo resist. In an embodiment, the two openings are formed by removing two portions of the second BARC, and before the second BARC is etched, the two portions of the second BARC and the remaining portion of the second BARC are overlapped by the opening in the photo resist. In an embodiment, the method further comprises forming a polymer layer over and contacting the photo resist and the second BARC; and etching the polymer layer. In an embodiment, the polymer layer is etched without forming an etching mask over the polymer layer. In an embodiment, the polymer layer is a conformal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a tetra-layer etching mask over a target layer, wherein the tetra-layer etching mask comprises:
        a first Bottom Anti-Reflective Coating (BARC);
        a hard mask over the first BARC;
        a second BARC over the hard mask; and
        a photo resist over the second BARC;
    patterning the photo resist to form an opening, wherein a top surface of the second BARC is exposed to the opening, and the top surface is a top surface of a first portion and a second portion of the second BARC;
    forming a polymer layer on the photo resist, wherein the polymer layer comprises a higher portion directly over the photo resist, and a lower portion extending into the opening to contact the top surface of the first portion of the second BARC;
    etching the polymer layer and the second BARC, wherein the first portion of the second BARC is removed in the etching, and the second portion of the second BARC remains after the etching;
    etching the hard mask using the second BARC as an etching mask;
    etching the first BARC; and
    etching the target layer.

2. The method of claim 1, wherein the forming the polymer layer comprises forming a conformal layer.

3. The method of claim 1, wherein after the etching the second BARC, the second BARC further comprises a third portion encircling the second portion, and the second portion is spaced apart from opposite sidewalls of the third portion of the second BARC.

4. The method of claim 3, wherein the second portion is fully separated from the third portion of the second BARC.

5. The method of claim 3, wherein the second portion has opposite ends connected to the third portion of the second BARC.

6. The method of claim 1, wherein the opening has a first width, and the second portion has a second width in a range between about 25 percent and about 40 percent of the first width.

7. The method of claim 1, wherein the etching the target layer comprises etching a work-function layer of a gate electrode of a transistor.

8. The method of claim 1, wherein the etching the target layer comprises etching a semiconductor fin.

9. The method of claim 1, wherein the etching the target layer comprises etching a dielectric layer to form an opening, and the method further comprises forming a conductive feature to fill the opening.

10. A method comprising:
    forming a polymer layer on a patterned photo resist, wherein the polymer layer extends into an opening in the patterned photo resist;
    etching the polymer layer to expose the patterned photo resist;
    etching the polymer layer and a top Bottom Anti-Reflective Coating (BARC) to pattern the top BARC, wherein the patterned photo resist is used as an etching mask; and
    using the top BARC as an etching mask to etching an underlying layer.

11. The method of claim 10, wherein the etching the underlying layer comprises:
    etching a hard mask underlying the top BARC; and
    etching a bottom BARC underlying the hard mask.

12. The method of claim 10, wherein the polymer layer comprises a first portion over the patterned photo resist, and a second portion in the opening and contacting the top BARC.

13. The method of claim 12, wherein the first portion and the second portion of the polymer layer have substantially a same depth.

14. The method of claim 10, wherein the polymer layer comprises an element selected from the group consisting of carbon, hydrogen, nitrogen, boron, chlorine, and combinations thereof.

15. The method of claim 10, wherein the polymer layer and the top BARC are etched using $N_2$, $H_2$, and $CH_4$.

16. A method comprising:
    forming a tetra-layer etching mask over a target layer, wherein the tetra-layer etching mask comprises:
        a first Bottom Anti-Reflective Coating (BARC);
        a hard mask over the first BARC;
        a second BARC over the hard mask; and
        a photo resist over the second BARC;

patterning the photo resist to form an opening; and etching the second BARC, the hard mask, and the first BARC, with the patterned photo resist being used as a portion of an etching mask, wherein after the etching, two openings are formed in the second BARC, with the two openings being separated apart from each other by a remaining portion of the second BARC, and the two openings and the remaining portion of the second BARC in combination have a width substantially equal to a corresponding width of the opening in the photo resist.

17. The method of claim 16, wherein the two openings are formed by removing two portions of the second BARC, and before the second BARC is etched, the two portions of the second BARC and the remaining portion of the second BARC are overlapped by the opening in the photo resist.

18. The method of claim 16 further comprising:

forming a polymer layer over and contacting the photo resist and the second BARC; and etching the polymer layer.

19. The method of claim 18, wherein the polymer layer is etched without forming an etching mask over the polymer layer.

20. The method of claim 18, wherein the polymer layer is a conformal layer.

* * * * *